(12) United States Patent
Shinohara et al.

(10) Patent No.: US 7,003,622 B2
(45) Date of Patent: Feb. 21, 2006

(54) SEMICONDUCTOR MEMORY

(75) Inventors: Hirofumi Shinohara, Tokyo (JP); Yoshiki Tsujihashi, Tokyo (JP); Takeshi Hashizume, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 158 days.

(21) Appl. No.: 10/167,087

(22) Filed: Jun. 12, 2002

(65) Prior Publication Data
US 2003/0028710 A1 Feb. 6, 2003

(30) Foreign Application Priority Data
Jul. 31, 2001 (JP) .............................. 2001-232502

(51) Int. Cl.
*G06F 12/00* (2006.01)
(52) U.S. Cl. .............................. 711/104; 711/4; 711/5; 711/100; 711/103; 365/185.09; 365/200; 365/230.03; 365/230.06; 365/230.07; 365/231
(58) Field of Classification Search ................ 711/100, 711/119, 161–162, 114, 102–105, 108, 111, 711/4–5; 710/104; 365/200–201, 185.29, 365/180.07, 189.05, 230.03, 195, 225.07, 365/185.09, 230.06–230.07, 231; 714/6, 714/30, 710, 711; 65/225.07
See application file for complete search history.

(56) References Cited

U.S. PATENT DOCUMENTS

| | | | | |
|---|---|---|---|---|
| 5,349,558 A | * | 9/1994 | Cleveland et al. | 365/200 |
| 5,386,386 A | * | 1/1995 | Ogihara | 365/200 |
| 5,550,394 A | * | 8/1996 | Sukegawa et al. | 257/209 |
| 5,715,202 A | * | 2/1998 | Harima | 365/200 |
| 5,831,913 A | | 11/1998 | Kirihata | |
| 5,940,335 A | * | 8/1999 | Kirihata | 365/200 |
| 6,038,175 A | * | 3/2000 | Ra | 365/185.29 |
| 6,038,179 A | * | 3/2000 | Eustis et al. | 365/200 |
| 6,067,260 A | * | 5/2000 | Ooishi et al. | 365/200 |
| 6,111,785 A | * | 8/2000 | Hirano | 365/185.09 |
| 6,246,616 B1 | * | 6/2001 | Nagai et al. | 365/200 |
| 6,317,846 B1 | * | 11/2001 | Higgins et al. | 714/30 |
| 6,393,504 B1 | * | 5/2002 | Leung et al. | 710/104 |
| 6,484,271 B1 | * | 11/2002 | Gray | 714/6 |

(Continued)

FOREIGN PATENT DOCUMENTS

JP 0721796 1/1995

(Continued)

Primary Examiner—Matthew Kim
Assistant Examiner—Zhou H. Li
(74) Attorney, Agent, or Firm—Buchanan Ingersoll PC

(57) ABSTRACT

A semiconductor memory includes a redundant RAM disposed independently of at least one regular RAM, the redundant RAM having redundant memory elements by which defective memory elements of the regular RAM can be replaced, and a control block for selecting either at least the regular RAM or the redundant RAM according to an address applied thereto, and for reading data from a memory cell of the selected RAM specified by the address. A plurality of regular RAMs can be disposed and the redundant RAM includes redundant memory elements by which defective memory elements of an arbitrary one of the plurality of regular RAMs can be replaced. The control block selects either one of the plurality of regular RAMs or the redundant RAM according to an address applied thereto, and reads data from a memory cell of the selected RAM specified by the address.

6 Claims, 16 Drawing Sheets

U.S. PATENT DOCUMENTS

| | | | |
|---|---|---|---|
| 6,640,321 B1 * | 10/2003 | Huang et al. | 714/720 |
| 2001/0030893 A1 * | 10/2001 | Terzioglu et al. | 365/200 |
| 2001/0040830 A1 * | 11/2001 | Matsui et al. | 365/200 |
| 2002/0169922 A1 * | 11/2002 | Thomann et al. | 711/100 |
| 2003/0005225 A1 * | 1/2003 | Smits | 711/119 |

FOREIGN PATENT DOCUMENTS

| | | |
|---|---|---|
| JP | 10275497 | 10/1998 |
| JP | 11306790 | 11/1999 |
| JP | 2001256795 | 9/2001 |

* cited by examiner

|  | COLUMN REDUNDANCY HITR=0 | ROW REDUNDANCY HITR=1 |
|---|---|---|
| XR<0> | X<0> | X<0> |
| XR<1> | X<1> | Y<0> |
| XR<2> | X<2> | Y<1> |
| XR<3> | X<3> | Y<2> |
| XR<4> | X<4> | Y<3> |
| XR<5> | X<5> | Y<4> |
| XR<6> | X<6> | ENCR<0> |
| XR<7> | X<7> | ENCR<1> |
| XR<8> | X<8> | ENCR<2> |
| YR<0> | ENCC<0> | ENCC<0> |
| YR<1> | ENCC<1> | ENCC<1> |
| YR<2> | ENCC<2> | ENCC<2> |

|  | HITC=1(HITR=0) | | | | | | | HITR=1 |
|---|---|---|---|---|---|---|---|---|
|  | HITC0=1 | HITC1=1 | HITC2=1 | HITC3=1 | HITC4=1 | HITC5=1 | HITC6=1 |  |
| ENCC<0> | 0 | 1 | 0 | 1 | 0 | 1 | 0 | 1 |
| ENCC<1> | 0 | 0 | 1 | 1 | 0 | 0 | 1 | 1 |
| ENCC<2> | 0 | 0 | 0 | 0 | 1 | 1 | 1 | 1 |

|  | HITR0=1 | HITR1=1 | HITR2=1 | HITR3=1 | HITR4=1 | HITR5=1 | HITR6=1 | HITR7=1 |
|---|---|---|---|---|---|---|---|---|
| ENCR<0> | 0 | 1 | 0 | 1 | 0 | 1 | 0 | 1 |
| ENCR<1> | 0 | 0 | 1 | 1 | 0 | 0 | 1 | 1 |
| ENCR<2> | 0 | 0 | 0 | 0 | 1 | 1 | 1 | 1 |

| | COLUMN REDUNDANCY HITR=0 | ROW REDUNDANCY HITR=1 |
|---|---|---|
| YR<0> | X<0> | X<0> |
| XR<0> | X<1> | Y<0> |
| XR<1> | X<2> | Y<1> |
| XR<2> | X<3> | Y<2> |
| XR<3> | X<4> | Y<3> |
| XR<4> | X<5> | Y<4> |
| XR<5> | X<6> | ENCR<0> |
| XR<6> | X<7> | ENCR<1> |
| XR<7> | X<8> | ENCR<2> |
| YR<1> | ENCC<0> | ENCC<0> |
| YR<2> | ENCC<1> | ENCC<1> |
| YR<3> | ENCC<2> | ENCC<2> |

FIG.17

| TERMINAL NAMES OF HORIZONTALLY ORIENTED RAM | SIGNAL NAMES |
|---|---|
| YNb<0> | X<0> |
| XNb<0> | X<1> |
| XNb<1> | X<2> |
| XNb<2> | X<3> |
| XNb<3> | X<4> |
| XNb<4> | X<5> |
| XNb<5> | X<6> |
| XNb<6> | X<7> |
| XNb<7> | X<8> |
| YNb<1> | Y<0> |
| YNb<2> | Y<1> |
| YNb<3> | Y<2> |
| YNb<4> | Y<3> |

FIG.18

| TERMINAL NAMES OF HORIZONTALLY ORIENTED RAM | SIGNAL NAMES |
|---|---|
| XNb<0> | X<0> |
| XNb<1> | X<1> |
| XNb<2> | X<2> |
| XNb<3> | X<3> |
| XNb<4> | X<4> |
| XNb<5> | X<5> |
| XNb<6> | X<6> |
| XNb<7> | X<7> |
| YNb<0> | X<8> |
| YNb<1> | Y<0> |
| YNb<2> | Y<1> |
| YNb<3> | Y<2> |
| YNb<4> | Y<3> |

FIG.21

|  | COLUMN REDUNDANCY HITB=0 AND HITR=0 | ROW REDUNDANCY HITB=0 AND HITR=1 | BIT REDUNDANCY HITB=1 |
|---|---|---|---|
| XR<0> | X<0> | X<0> | X<0> |
| XR<1> | X<1> | Y<0> | X<1> |
| XR<2> | X<2> | Y<1> | Y<0> |
| XR<3> | X<3> | Y<2> | Y<1> |
| XR<4> | X<4> | Y<3> | ENCB<0> |
| XR<5> | X<5> | Y<4> | ENCB<1> |
| XR<6> | X<6> | ENCR<0> | ENCR<0> |
| XR<7> | X<7> | ENCR<1> | ENCR<1> |
| XR<8> | X<8> | ENCR<2> | ENCR<2> |
| YR<0> | ENCC<0> | ENCC<0> | ENCC<0> |
| YR<1> | ENCC<1> | ENCC<1> | ENCC<1> |
| YR<2> | ENCC<2> | ENCC<2> | ENCC<2> |

FIG.22

|  | HITC=1(HITB=0 AND HITR=0) | | | | | | | HITB=1 OR HITR=1 |
|---|---|---|---|---|---|---|---|---|
|  | HITC0=1 | HITC1=1 | HITC2=1 | HITC3=1 | HITC4=1 | HITC5=1 | HITC6=1 |  |
| ENCC<0> | 0 | 1 | 0 | 1 | 0 | 1 | 0 | 1 |
| ENCC<1> | 0 | 0 | 1 | 1 | 0 | 0 | 1 | 1 |
| ENCC<2> | 0 | 0 | 0 | 0 | 1 | 1 | 1 | 1 |

FIG.23

|  | HITB=0 | | | | | | | HITB=1 |
|---|---|---|---|---|---|---|---|---|
|  | HITR0=1 | HITR1=1 | HITR2=1 | HITR3=1 | HITR4=1 | HITR5=1 | HITR6=1 |  |
| ENCR<0> | 0 | 1 | 0 | 1 | 0 | 1 | 0 | 1 |
| ENCR<1> | 0 | 0 | 1 | 1 | 0 | 0 | 1 | 1 |
| ENCR<2> | 0 | 0 | 0 | 0 | 1 | 1 | 1 | 1 |

|         | HITB0=1 | HITB1=1 | HITB2=1 | HITB3=1 |
|---------|---------|---------|---------|---------|
| ENCB<0> | 0       | 1       | 0       | 1       |
| ENCB<1> | 0       | 0       | 1       | 1       |

SEMICONDUCTOR MEMORY

BACKGROUND OF THE INVENTION

1. Field of the Invention

The present invention relates to a semiconductor memory equipped with redundant memory elements. More particularly, it relates to a semiconductor memory that can replace one or more defective memory elements in a regular RAM with one or more redundant memory elements in a redundant RAM which is disposed independently of the regular RAM.

2. Description of Related Art

FIG. 25 is a block diagram showing the structure of a prior art semiconductor memory. The semiconductor memory shown in FIG. 25 is a 256 Kb RAM with a 16K words×16 bits structure. In FIG. 25, reference numeral 1 denotes a regular memory cell array with 512 rows and 256 columns, reference numeral 2 denotes a redundant row line which is a redundant memory element that can replace a defective row line of the regular memory cell array, reference numeral 3 denotes a redundant column line which is a redundant memory element that can replace a defective column line of the regular memory cell array, reference numeral 4 denotes a control circuit/address buffer for buffering an input row address X<8;0> and an input column address Y<4;0> and for controlling the semiconductor memory according to a cell enable signal CEC (abbreviated as CEC signal from here on) and a write enable signal (abbreviated as WEC signal from here on) applied thereto, reference numeral 5 denotes a regular row decoder for decoding a row address XA buffered by the control circuit/address buffer 4, reference numeral 6 denotes a redundant row decoder for generating an NED (Normal Element Disable) signal at state "1" when the row address XA applied thereto matches up with an address specified by a fuse 7 intended for redundant row lines, reference numeral 8 denotes a column decoder for decoding a column address YA buffered by the control circuit/address buffer 4, reference numeral 9 denotes a column selector for connecting one of 32 pairs of bit lines to an I/O line according to a column selection signal CSEL (abbreviated as CSEL signal from here on) output from the column decoder 8, reference numeral 10 denotes a block including an I/O selector and fuse intended for redundant column lines, and reference numeral 11 denotes a data I/O circuit.

FIG. 26 is a block diagram showing connections among the components of the prior art semiconductor memory shown in FIG. 25, and shows a part of the prior art semiconductor memory which corresponds to the right half of FIG. 25 for simplicity of the drawing.

The semiconductor memory does not activate any redundant memory element when there is no defective element in the regular memory cell array 1. In this case, the regular row decoder 5 decodes a row address XA being buffered by the control circuit/address buffer 4, and then selects one row line from among the 512 row lines and sets a corresponding word line WL to "1" and sets all of remaining word lines WL to "0". At this time, the redundant row decoder 6 outputs an NED signal at state "0" regardless of the row address XA. As a result, one row line of the regular memory cell array 1 is selected and a memory cell on the row line is connected to a bit line BL. The column decoder 8 then decodes a column address YA being buffered by the control circuit/address buffer 4, and sets a corresponding one of 32 CSEL signals to "1" and sets all of the remaining signals to "0". As a result, a 32-to-1 multiplexer 91 of the column selector 9 connects one of the 32 pairs of bit lines to the I/O line according to the CSEL signal. A 2-to-1 multiplexer 102 of the I/O selector 10 then connects the regular I/O line to the data I/O circuit 11 disposed for every 32 row lines. As a result, the regular memory cell is connected to the data I/O circuit 11, and writing or reading of data in or from the memory cell is done (i.e., the memory cell is accessed). When reading data from the memory cell a sense amplifier/write driver 111 amplifies an electric charge on the bit line BL connected to the data I/O circuit 11, whereas when writing data in the memory cell the sense amplifier/write driver 111 sends data applied thereto onto the bit line BL connected to the data I/O circuit 11 and writes the data in the memory cell.

When there is a row defect in the regular memory cell array 1, an enable fuse FEN (not shown in the figure) in the fuse 7 intended for redundant row lines and an address fuse FXAi (not shown in the figure) corresponding to the address of the defective row line are cut by using a laser trimming apparatus. As a result, a corresponding fuse determination circuit (not shown in the figure) in the fuse 7 intended for redundant row lines outputs FENO and FXAiO signals at state "1". In contrast, any other fuse determination circuit corresponding to a fuse which has been not cut sends out a signal at state "0".

The redundant row decoder 6 outputs an NED signal at state "1" when the input row address XA matches up with the address of a defective row line (i.e., the FXAiO signal) which is programmed into the address fuse FXAi. The regular row decoder 5 sets all outputs to "0" in response to the NED signal. As a result, the redundant row line 2 is connected to a bit line BL. After that, one of the 32 pairs of bit lines is connected to the I/O line and the data I/O circuit 11, as in the case where there is no defective memory cell in the regular memory cell array 1, and a specified memory cell within the redundant row line 2 is accessed. When the row address XA does not match up with any defective row address programmed to each fuse FXAi, the redundant row decoder 6 outputs the NED signal at state "0". Therefore, in this case the regular row decoder 5 operates as in the case where there is no defective memory cell in the regular memory cell array 1, and a regular memory cell specified by the row address XA and the column address YA is accessed.

When there is a column defect in the regular memory cell array 1, fuses FY corresponding to a set of 32 column lines including the defective column line within the fuse 101 intended for redundant column lines are cut by using a laser trimming apparatus. As a result, the fuse determination circuit (not shown in the figure) within the fuse 101 intended for redundant column lines outputs an FYr (r=0 to 15) signal at state "1". In contrast, other fuse determination circuits corresponding to fuses which have been not cut output FYr signals at state "1". The column decoder 8 decodes the column address YA being buffered by the control circuit/address buffer 4, and sets a corresponding one of the 32 CSEL signals to "1" and sets all of the remaining CESL signals to "0". As a result, the 32-to-1 multiplexer 92 intended for redundant column lines of the column selector 9 connects a corresponding one of the 32 pairs of bit lines to the I/O line associated with redundant column lines according to the CSEL signal. The 2-to-1 multiplexer 102 of the I/O selector 10 receives the outputs FYr of the fuse determination circuits within the fuse 101 intended for redundant column lines, and connects the I/O line associated with redundant column lines to the data I/O circuit 11 corresponding to the set of 32 column lines including the defective column line and also connects the regular I/O line to the other data I/O circuits 11. The word line selection is carried out as in the case where there is no defective memory cell in the regular memory cell array 1 and in the case where there is a row defect in the regular memory cell array 1. Thus, the redundant column line 3 is accessed in place of the set of 32 column lines including the defective column line.

When there is a single bit defect in the regular memory cell array 1, it is possible to repair it by using either the redundant row line 2 or the redundant column line 3.

FIG. 27 is a schematic diagram showing the structure of a prior art semiconductor memory with a variable-size redundant replacement structure as disclosed in Japanese patent application publication (TOKKAIHEI) No. 10-275497. In the figure, reference numeral 60 denotes a 256 Mb DRAM chip which is the prior art semiconductor memory, reference numeral 61 denotes a 16 Mb unit, reference numeral 62 denotes a 1 Mb block, reference numeral 63 denotes a main 16 Mb array that contains sixteen 1 Mb blocks 62, reference numeral 64 denotes a 128 Kb redundant block, reference numeral 65 denotes a redundant unit control circuit, reference numeral 67 denotes an NMOS device that constitutes a memory cell in cooperation with a capacitor 66, reference numeral 68 denotes a sense amplifier, reference numeral 70 denotes an NMOS device which constitutes a redundant memory cell in cooperation with a capacitor 69, and reference numeral 71 denotes a sense amplifier.

As shown in FIG. 27, the 256 Mb DRAM chip 60 consists of the sixteen 16 Mb units 61, and each 16 Mb unit 61 delimits an area of thereof in which a defect which can be repaired can be caused. Each 16 Mb unit 61 has a main 16 Mb array 63 that consists of sixteen 1 Mb blocks (subarrays) 62, a 128 Kb redundant block 64, and a redundant unit control circuit 65, and each 1 Mb block 62 has 1M cells. While each 1 Mb block 62 includes 512 word lines WL, when a specific 1 Mb block 62 is activated, only one word line WL is selected and a capacitive charge on a corresponding capacitor 66 is sent to a corresponding bit line by way of a corresponding NMOS device 67. A corresponding sense amplifier 68 then amplifies the electric charge on the bit line BL. The amplified bit information is selected by a corresponding column address (not shown in the figure), and is sent to a data output circuit (also not shown in the figure).

Each 1 Mb block 62 has no redundant word line. For the sake of repairing a defect of the 16 Mb unit 61, the 128 Kb redundant blocks 64 provided with sixteen variable-size redundant units RU0 to RU15 is designed to replace the defect that resides in any one of the sixteen 1 Mb blocks 62. Each of the redundant units RU0 to RU7 contains a single redundant word line, each of the redundant units RU8 to RU11 contains two redundant word lines, each of the redundant units RU12 and RU13 contains four redundant word lines, and the redundant units RU14 and RU15 contain eight and thirty-two redundant word lines, respectively.

When the redundant unit control circuit 65 is enabled, all of 8,192 word lines WL within the main 16 Mb array 63 are disabled. Instead, one of the 64 redundant word lines within the 128 Kb redundant block 64 is activated. As a result, a capacitive charge on a corresponding capacitor 69 is sent to a corresponding bit line by way of a corresponding NMOS device 70. A corresponding sense amplifier 71 then amplifies the electric charge on the bit line BL. The amplified bit information is selected by a corresponding column address (not shown in the figure), and is sent to a data output circuit (also not shown in the figure).

A problem with a prior art semiconductor memory constructed as mentioned above is that since a regular memory cell array and a redundant block are not disposed independently of each other, and whenever the structure of the regular memory cell array or the structure of the redundant block is changed, it is necessary to design the entire semiconductor memory again, a lot of design time, especially time required for layout design is needed and the design cost is increased. Moreover, another problem is that when increasing or decreasing the number of memory elements included in the redundant block according to the scale of the semiconductor memory or the defect density caused by a wafer production line, it is necessary to do the design of the entire semiconductor memory again, and the re-designing counts against ASICs which require a short design time.

In addition, since a row or column line, which can be replaced, is limited to the one in a regular memory cell array which shares bit lines and a word line with another line in the prior art semiconductor memory shown in FIGS. 25 and 26, although when there are two defects, for example, it is possible to repair them if the two defective lines are located in the right-hand and left-hand sides of the regular memory cell array, respectively, it is impossible to repair them if the two defective lines are located in only one of the right-hand and left-hand sides of the regular memory cell array. In other words, the effective use of the redundant memory element is not performed, and the yield improvement efficiency is bad.

Furthermore, since in the prior art semiconductor memory shown in FIG. 27 a redundant block can repair only defective lines included in a 16 Mb unit in which the redundant block is disposed, when three sets of 32 defective row lines are concentrated on one 16 Mb unit, for example, a corresponding redundant block is not able to repair these defective row lines. In addition, another problem is that since a defective zone can be replaced only by one zone having the same shape as the defective zone within a redundant block, it is impossible to do replacement with efficiency.

SUMMARY OF THE INVENTION

The present invention is proposed to solve the above-mentioned problems, and it is therefore an object of the present invention to provide a semiconductor memory capable of shortening the design time, reducing the chip area, and improving yields, and applicable to a system LSI, such as an ASIC, by disposing a redundant RAM including redundant memory elements independently of regular RAMs to repair defective memory elements.

In accordance with an aspect of the present invention, there is provided a semiconductor memory including a redundant RAM disposed independently of at least one regular RAM, the redundant RAM having redundant memory elements by which defective memory elements of the regular RAM can be replaced, and a control block for selecting either at least the regular RAM or the redundant RAM according to an address applied thereto, and for reading data from a memory cell of the selected RAM specified by the address to output the data. Consequently, the aspect of the present invention offers an advantage of being able to repair defective memory elements by replacing the defective memory elements with redundant memory elements by using the redundant RAM disposed independently of the regular RAM. Furthermore, the provision of the redundant RAM disposed independently of the regular RAM can reduce a time period required for designing the entire semiconductor memory again followed by a change in the structure of the regular RAM, especially a time period required for the layout design as compared with the prior art, thus decreasing the design cost.

In accordance with another aspect of the present invention, there is provided a semiconductor memory including a control block for, in order to repair a defective column line in a regular RAM, simultaneously replacing a plurality of corresponding column lines associated with a plurality of bits and including the defective column line with a plurality of redundant memory elements so that the replacements of the plurality of columns are carried out in synchronization with one another. Consequently, the further aspect of the present invention offers an advantage of being able to simplify the control block.

In accordance with a further aspect of the present invention, there is provided a semiconductor memory including a control block, responsive to an address applied thereto, for reading data from a memory cell of a regular RAM specified by the address to output the data, the control block performing control operations so as to read and output the data within a time period during which inputs of the semiconductor memory are setup. Consequently, the other aspect of the present invention offers an advantage of being able to make a period of time during which the logical values of input signals applied to the regular RAM are set up longer.

In accordance with another aspect of the present invention, there is provided a semiconductor memory including a control block, responsive to an address applied thereto, for reading data from a memory cell of a regular RAM specified by the address to output the data, input signals being applied to the semiconductor memory in synchronization with a previous clock edge prior to a clock edge that defines timing at which input signals are input to the regular RAM. Consequently, the other aspect of the present invention offers an advantage of being able to make a period of time during which the logical values of input signals applied to the regular RAM are set up longer.

Further objects and advantages of the present invention will be apparent from the following description of the preferred embodiments of the invention as illustrated in the accompanying drawings.

BRIEF DESCRIPTION OF THE DRAWINGS

FIG. 17 is a table showing an address scramble table intended for a horizontally oriented regular RAM when the redundant RAM has a memory cell array shown in FIG. 4 in the floor plan shown in FIG. 13;

FIG. 18 is a table showing an undesirable address scramble table intended for a horizontally oriented regular RAM when the redundant RAM has a memory cell array shown in FIG. 4 in the floor plan shown in FIG. 13;

FIG. 21 is a table showing an address scramble table intended for the redundant RAM in the case of column redundancy, row redundancy, and bit redundancy in the semiconductor memory according to the second embodiment of the present invention;

FIG. 22 is a table showing an address ENCC<2;0> generated by an address encoder intended for redundant column lines included in a control block of the semiconductor memory according to the second embodiment of the present invention;

FIG. 23 is a table showing an address ENCR<2;0> generated by an address encoder intended for redundant row lines included in the control block of the semiconductor memory according to the second embodiment of the present invention;

DETAILED DESCRIPTION OF THE PREFERRED EMBODIMENTS

Embodiment 1.

Figure 1:
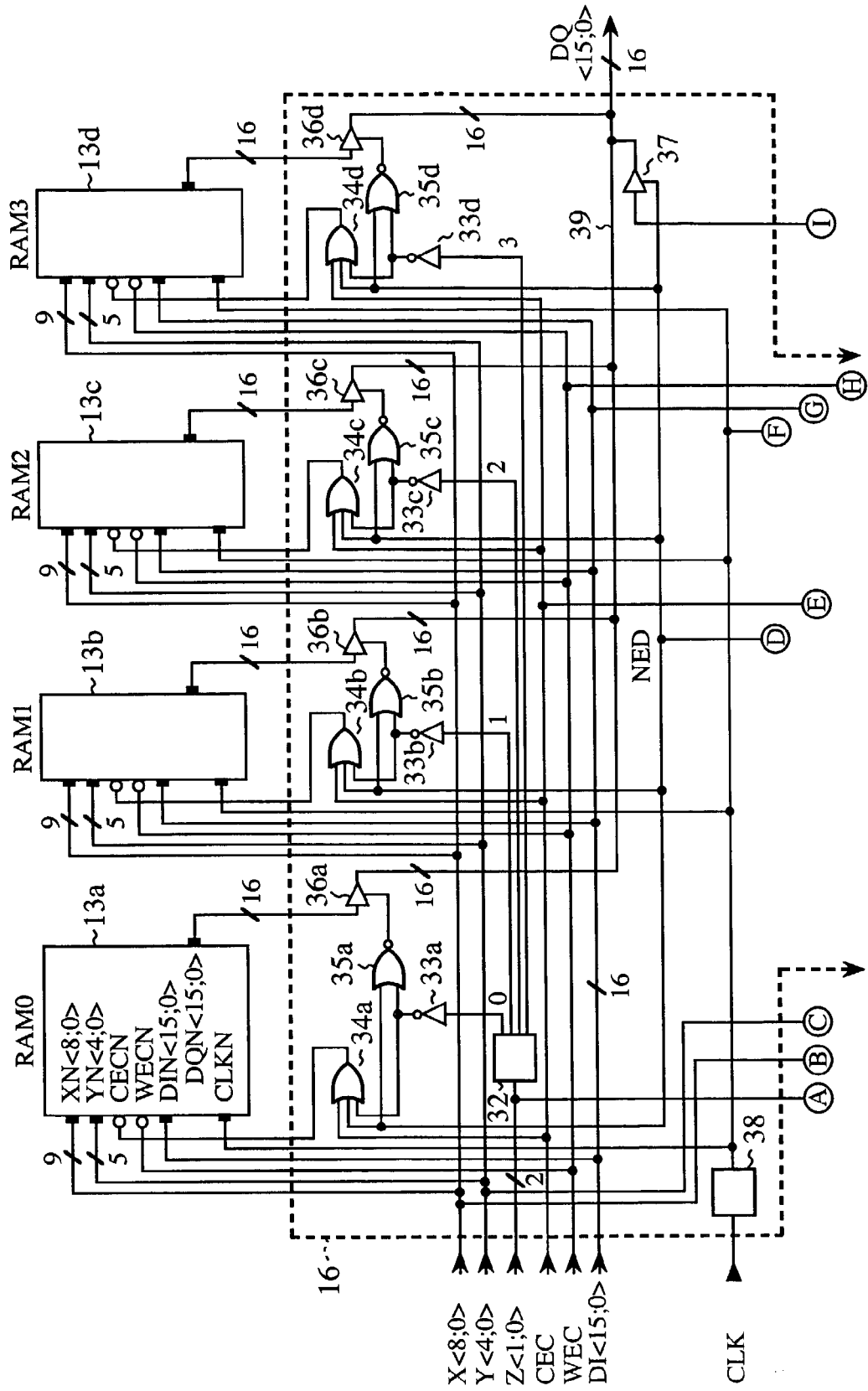
FIG. 1 is a block diagram showing the structure of regular RAMs and peripheral circuits of a semiconductor memory according to a first embodiment of the present invention.
Figure 2:
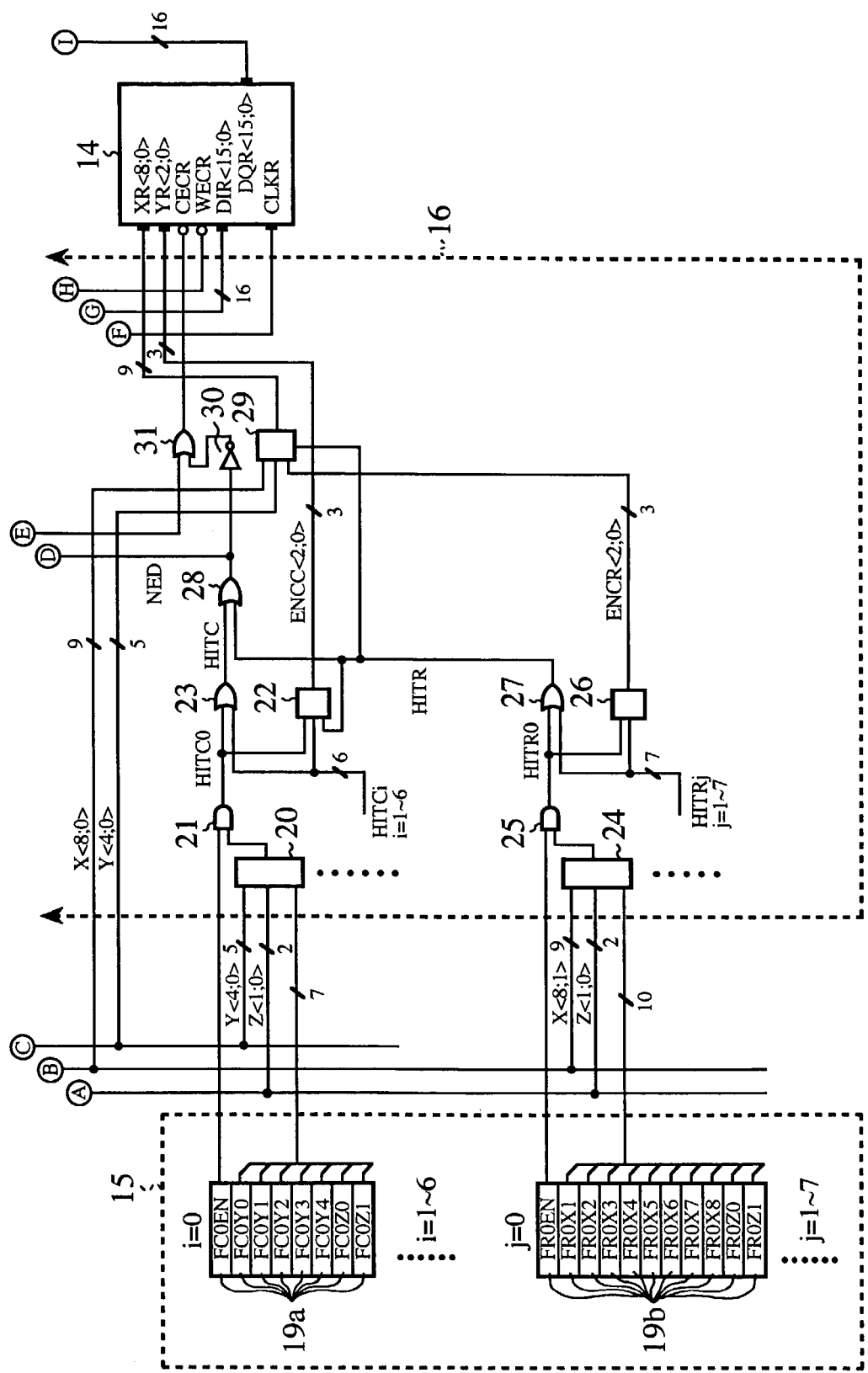
FIG. 2 is a block diagram showing the structure of the regular RAMs and the peripheral circuits of the semiconductor memory according to a first embodiment of the present invention.

FIGS. 1 and 2 are block diagrams showing the structure of a semiconductor memory according to a first embodiment of the present invention. The semiconductor memory according to the first embodiment of the present invention is a 1 Mb RAM with a 64K words×16 bits structure. However, the first embodiment of the present invention is not limited to a 1 Mb RAM with a 64K words×16 bits structure.

In FIGS. 1 and 2, reference numerals 13a to 13d denote 256 Kb regular RAMs with a 16K words×16 bits structure, respectively. The semiconductor memory according to the first embodiment of the present invention is thus provided with the four regular RAMs 13a to 13d (i.e., RAM0, RAM1, RAM2, and RAM3). Each regular RAM is provided with two regular memory cell arrays each having 512 rows and 256 columns. Furthermore, reference numeral 14 denotes a 64 Kb redundant RAM with a 4K words×16 bits structure, the redundant RAM 14 being provided with two memory cell arrays each having 512 rows and 64 columns, reference numeral 15 denotes a fuse block that contains fuses each of which can be programmed to specify either a column line including one or more defective memory elements, i.e., a defective column or row line including one or more defective memory elements, i.e., a defective row line, and reference numeral 16 denotes a control block for determining whether or not an externally applied address is associated with a defective column or row line based on outputs of fuse determination circuits (not shown) included in the fuse block 15, for generating an address specifying a redundant memory element (i.e, redundant column or row line) of the redundant RAM 14 by which a defective column or row line is to be replaced if so and outputting the generated address to the redundant RAM 14, and for furnishing 16-bit data output from the redundant RAM 14 as DQ<15;0>.

An address applied to the semiconductor memory according to the first embodiment, which is a 1 Mb RAM with a 64K words×16 bits structure, is a 16-bit one including X<8;0>, Y<4;0>, and Z<1;0>. The row address X<8;0> is input as a regular RAM row address XN<8;0> to each regular RAM, and the column address Y<4;0> is input as a regular RAM column address YN<4;0> to each regular RAM. The RAM selection address Z<1;0> is decoded, and when there is no defective element in any regular RAM, the output of one of the four regular RAMs specified by the RAM selection address Z<1;0> is selected and is output as DQ<15;0>. Each regular RAM consists of 16 blocks each of which can be assumed to be a RAM that sends out a 1-bit output, and sends out a 16-bit output DQN<15;0> according to the 9-bit regular RAM row address XN<8;0> and the 5-bit regular RAM column address YN<4;0> applied thereto. The control block 16 of the semiconductor memory decodes the RAM selection address Z<1;0>, selects one regular RAM, which is specified by the RAM selection address Z<1;0>, from RAM0, RAM1, RAM2, and RAM3 when there is no defective element in the four regular RAMs, and sends out the output of the selected regular RAM.

Figure 3:
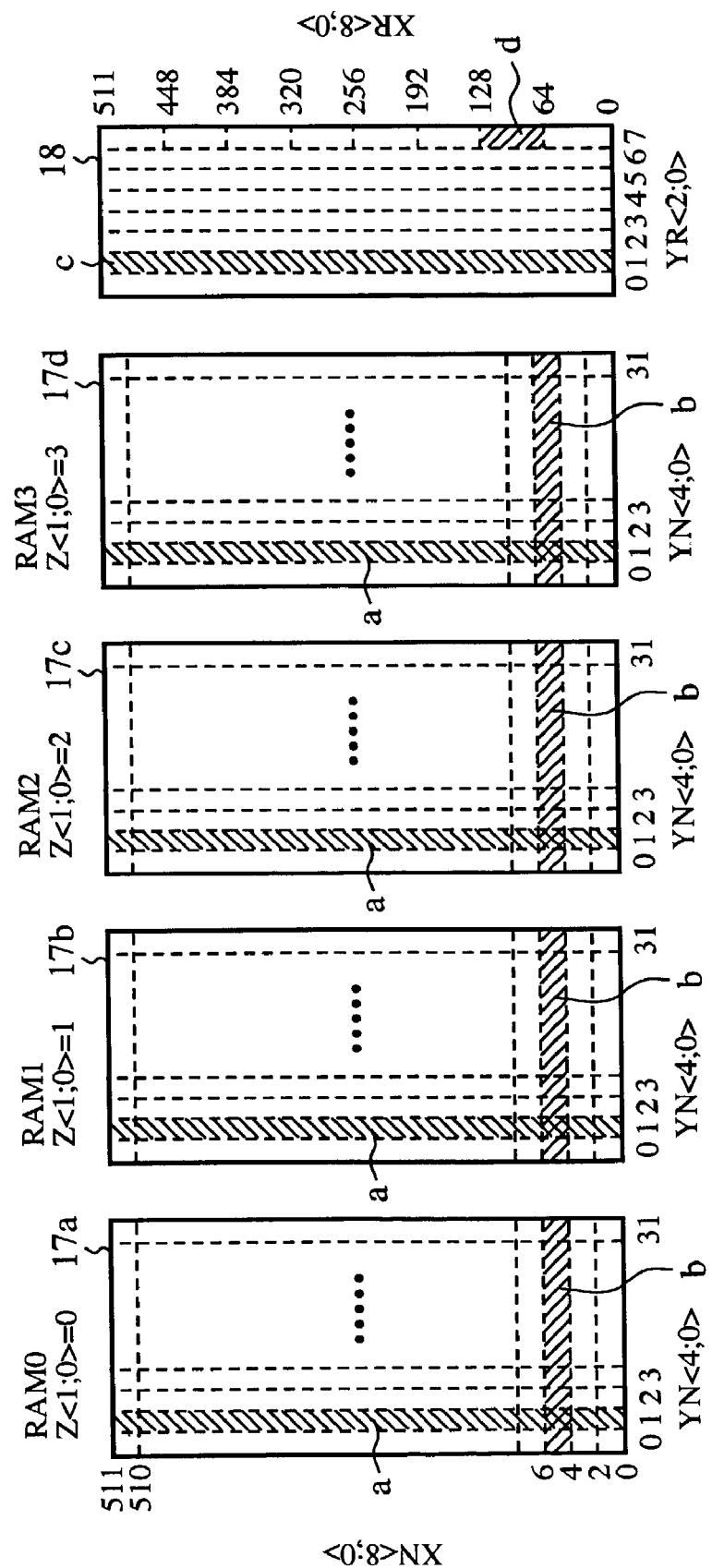
FIG. 3 is a diagram showing replacement mapping between memory elements, which are targets to be replaced in each regular RAM, and redundant memory elements of the redundant RAM in the semiconductor memory according to the first embodiment of the present invention.

FIG. 3 is a diagram showing a replacement mapping between a memory element (referred to as zone from here on) that is a target of a regular RAM, which can be replaced by a redundant memory element, and a redundant memory element (referred to as redundant zone from here on) of the redundant RAM 14. For simplicity of the drawing, FIG. 3 shows only a 1-bit unit (i.e., 1 block) of each regular RAM and also shows only a 1-bit unit of the redundant RAM 14 (each regular RAM and the redundant RAM 14 are generically called single RAMs from here on). Actually, the semiconductor memory can simultaneously replace 16 defective zones of one regular RAM which are defective column or row lines with 16 redundant zones, such as arbitrary column lines or regions, of the redundant RAM 14 while carrying out the replacements in synchronization with one another.

In FIG. 3, reference numerals 17a to 17d denote 1-bit memory cell array units of the four regular RAMs, respectively. The 1-bit memory cell array unit of each regular RAM consists of 512 rows and 32 columns and is logically divided into a plurality of zones, which are running longitudinally and latitudinally, by broken lines as shown in FIG. 3. Each vertically oriented a zone is a target to be replaced in the case of column replacement where a defective column line is replaced by a redundant zone, and has a size of 512 rows×1 column. Each horizontally oriented b zone is a target to be replaced in the case of row replacement where a defective row line is replaced by a redundant zone, and has a size of 2 rows×32 columns. In the 64K-word semiconductor memory including the four regular RAMs, there are 128 a zones and 1,024 b zones per 1 bit. While in the case of replacement of a defective column line with a redundant zone, 16 corresponding independent a zones each having 512 rows×1 column are replaced by 16 redundant zones at the same time, in the case of replacement of a defective row line with a redundant zone, one consecutive zone with 2 rows and 512 columns that extends over the two memory arrays of one regular RAM with a decoder being placed between the two memory arrays (i.e., 16 consecutive b zones) is replaced by 16 redundant zones at the same time.

Furthermore, reference numeral 18 denotes a 1-bit memory cell array unit of the 64 Kb redundant RAM 14. Each 1-bit memory cell array unit of the 64 Kb redundant RAM 14 has 512 rows and 8 columns, and is logically devided into a plurality of redundant zones which are extending vertically and horizontally by broken lines as shown in the figure. Each vertically oriented c redundant zone is a unit that can replace a defective column line of one regular RAM, and has a size of 512 rows×1 column. In other words, each c redundant zone has the same shape as each a zone of each regular RAM. Each vertically oriented d redundant zone is a unit that can replace a defective row line of one regular RAM, and has a size of 64 rows×1 column. The redundant RAM 14 includes 7 c redundant zones and 8 d redundant zones per bit, in the example shown in FIG. 3. Therefore, in the structure shown in FIG. 3, 7 arbitrary defective column lines which reside in the four regular RAMS can be replaced by the seven c redundant zones, and 8 arbitrary defective row lines which reside in the four regular RAMs can be replaced by the eight d redundant zones. In other words, the seven c redundant zones of the 1-bit memory cell array unit 18 of the redundant RAM 14 can replace 7 arbitrary a zones of the 128 a zones within the 1-bit memory cell array units 17$a$ to 17$d$ of the four regular RAMs, and the eight d redundant zones can replace eight arbitrary b zones of the 1,024 b zones of the 1-bit memory cell array units 17$a$ to 17$d$ of the four regular RAMS.

It should be noted that each d redundant zone has the same size of 64 memory cells as each b zone, but has a shape different from that of each b zone. To enable the mapping to a memory space having a different shape and the same size, that is, to enable access to each d redundant zone having such a different shape of the redundant RAM 14, the semiconductor memory performs address scrambling different from that performed for each regular RAM, as described later. Furthermore, even in the case of accessing each c redundant zone having the same shape as each a zone, the semiconductor memory performs address scrambling different from that performed for each regular RAM so as to enable the access to each c redundant zone of the redundant RAM 14, which can replace a defective a zone.

Figures 4, 5:
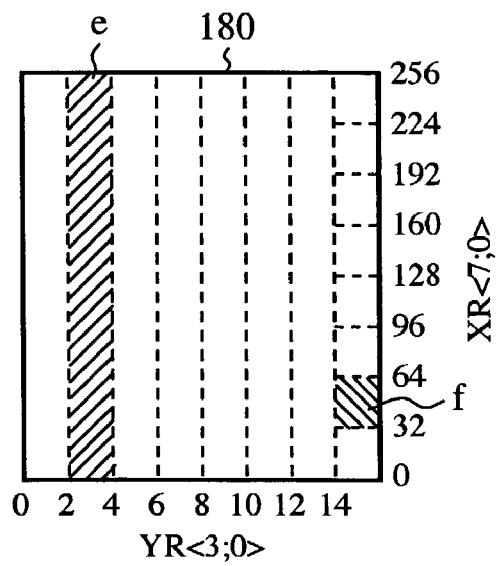
FIG. 4 is a diagram showing a 1-bit memory cell array unit of an example of the redundant RAM of the semiconductor memory according to the first embodiment of the present invention.
FIG. 5 is a table showing an address scramble table intended for the redundant RAM in the case of column redundancy and row redundancy in the semiconductor memory according to the first embodiment of the present invention.

The redundant RAM 14 is not limited to the one provided with the two memory cell arrays each having 512 rows and 64 columns. As an alternative, it can be a one provided with two memory cell arrays each having 256 rows and 128 columns. FIG. 4 is a diagram showing a 1-bit memory cell array unit 180 with 256 rows and 16 columns of the redundant RAM 14 in this case. This memory cell array unit 180 is logically divided into a plurality of redundant zones which are extending vertically and horizontally by broken lines as shown in the figure. Each vertically oriented e redundant zone is a unit that can replace a defective column line of one regular RAM when column replacement is carried out, has a size of 256 rows×2 columns, and corresponds to each c redundant zone of each 1-bit memory cell array unit 18 of the redundant RAM 14 of FIG. 3. Each vertically oriented f redundant zone is a unit that can replace a defective row line of one regular RAM when row replacement is carried out, has a size of 32 rows×2 columns, and corresponds to each d redundant zone of each 1-bit memory cell array unit 18 of the redundant RAM 14 of FIG. 3.

Figures 24, 25:
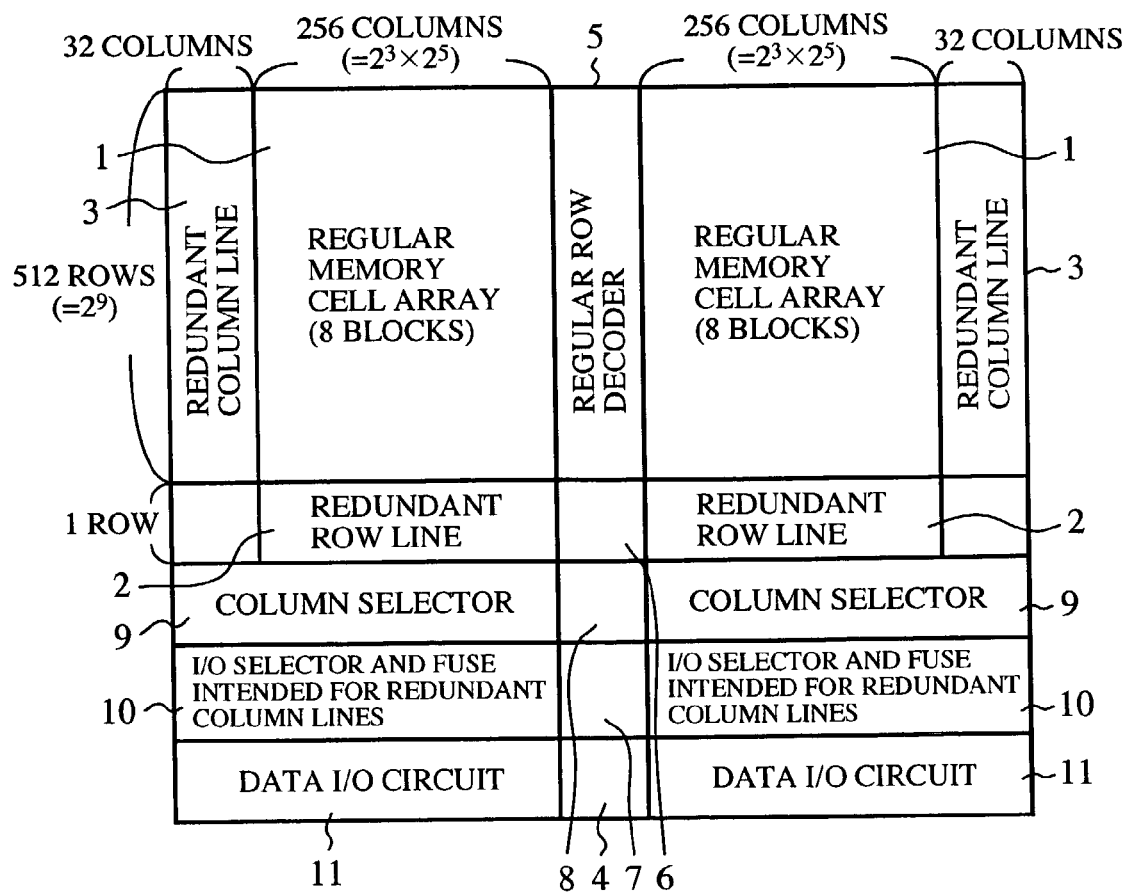
FIG. 24 is a table showing an address ENCB<2;0> generated by an address encoder intended for redundant bits included in the control block of the semiconductor memory according to the second embodiment of the present invention.
FIG. 25 is a schematic diagram showing the structure of a prior art semiconductor memory.
Figure 26:
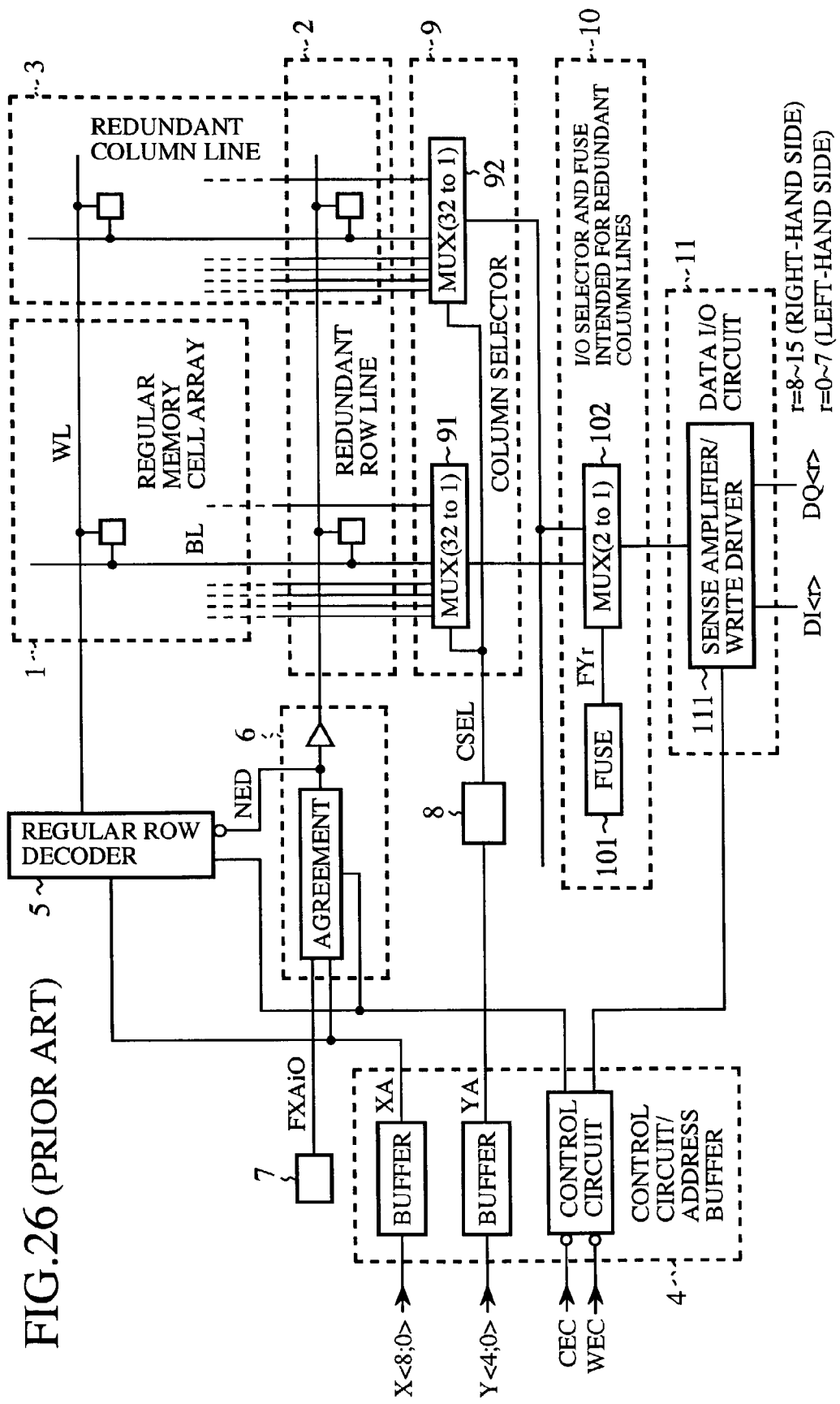
FIG. 26 is a block diagram showing the structure of the prior art semiconductor memory shown in FIG. 25.
Figure 27:
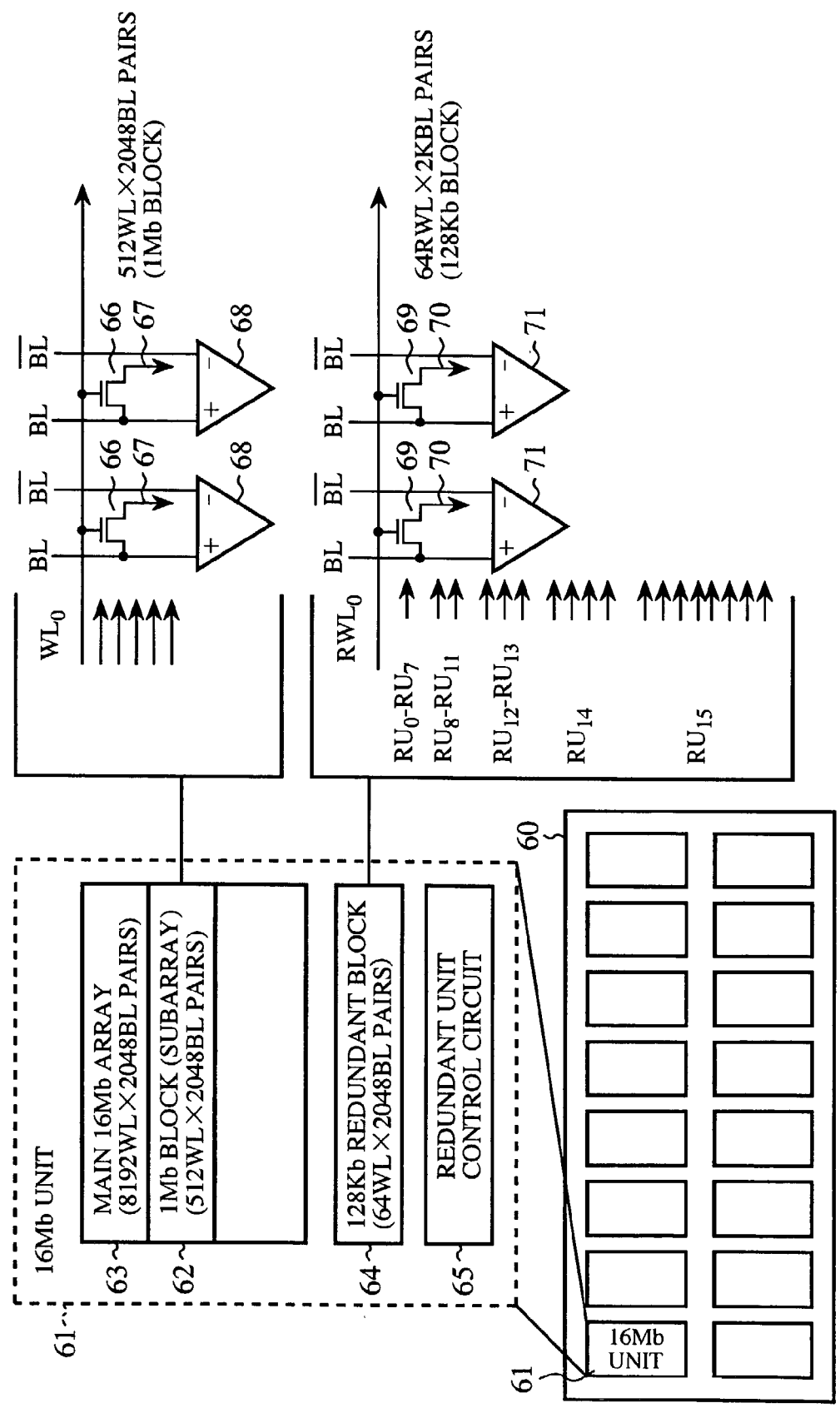
FIG. 27 is a schematic diagram showing the structure of another prior art semiconductor memory.

Here, comparison between the prior art using the four 256 Kb RAMs provided with redundant memory elements as shown in FIGS. 25 and 26 and the semiconductor memory provided with the redundant RAM 14 according to the first embodiment is made. While the prior art semiconductor memory has 8 sets of redundant column lines (=two sets per RAM×4, where each set corresponds to 32 columns), which can replace defective column lines, the semiconductor memory of the first embodiment includes seven sets of c redundant zones (1 set corresponds to a column) which can replace defective column lines. Conventionally, only when eight defective column lines are distributed among eight memory cell arrays, all of the eight redundant column lines are used. However, there is a very low possibility that such a case occurs. In contrast, even if the number of defective column lines is seven or less, it is impossible to disregard the possibility that two or more defective column lines concentrate on one memory cell array. Since the semiconductor memory according to the first embodiment can replace arbitrary defective column lines with c redundant zones by using the redundant RAM 14 disposed independently of the four regular RAMS, as previously mentioned, the semiconductor memory can implement replacements with a high degree of flexibility, thereby achieving higher yields.

While in the prior art the number of redundant row lines (the number of d redundant zones in the first embodiment) by which defective row lines can be replaced is four sets=one set per RAM×4 (each set corresponds to one row line), in the first embodiment the number of redundant row lines by which defective row lines can be replaced is eight sets (each set corresponds to one row line). Consequently, the semiconductor memory can implement replacements with a high flexibility and can also repair an increasing number of defective row lines.

On the other hand, while in the prior art the amount of overhead of memory cells used by the redundant circuit is 512×32×8=128K for redundant column lines and 512×1×4=2K for redundant row lines and the sum total of them is 130K, in the first embodiment the amount of overhead of memory cells used by the redundant circuit is 512×7×16=56K for redundant column lines and 512×2×8=8K for redundant row lines and the sum total of them is 64K. Thus, in the first embodiment, the amount of overhead of memory cells is small as compared with that in the prior art.

Next, a description will be made as to the structure of the control block 16 and the fuse block 15 which implement such replacements with reference to FIGS. 1 and 2.

In FIG. 2, reference numerals 19$a$ and 19$b$ denote single fuse blocks each provided with a program means, respectively. Each fuse block is so designed as to output "0" usually and to output "1" when a corresponding program means is programmed. Each program means can be a fuse programmed with laser trimming, an antifuse programmed by the application of a high voltage, an EPROM cell, a flip-flop or latch to which a value is logically set by a test circuit, or the like. Even if any one of them is used as each program means, the operation of the present invention and advantages provided by the present invention remain unchanged. When replacing an arbitrary defective column line of one regular RAM with the ith (i=0 to 6) c redundant zone of the redundant RAM 14, eight single fuse blocks 19$a$ used for replacement for defective column lines are disposed to generate one enable signal and seven address signals. In other words, to repair seven arbitrary defective column lines in the four regular RAMS, eight single fuse blocks 19$a$ are programmed for replacement for each of the seven defective column lines. A fuse determination circuit (not shown in the figure) is included in each of the eight single fuse blocks 19$a$ of each set, and outputs of those eight fuse determination circuits will be called FCiEN, FCiY0, FCiY1, FCiY2, FCiY3, FCiY4, FCiZ0, and FCiZ1 (i=0 to 6), respectively, from here on. Similarly, when replacing an arbitrary defective row line of one regular RAM with the jth (j=0 to 7) d redundant zone of the redundant RAM 14, eleven single fuse blocks 19$b$ used for replacement for defective row lines are disposed to generate one enable signal and ten address signals. In other words, to repair eight arbitrary defective row lines in the four regular RAMs, eleven single fuse blocks 19$b$ are programmed for replacement for each of the eight defective row lines. A fuse determination circuit (not shown in the figure) is included in each of the eleven single fuse blocks 19$b$ of each set, and outputs of those eleven fuse determination circuits will be called FRjEN, FRjX1, FRjX2, FRjX3, FRjX4, FRjX5, FRjX6, FRjX7, FRjX8, FRJZ0, and FRjZ1 (j=0 to 7), respectively, from here on.

Reference numeral 20 denotes an address comparison circuit intended for redundant column lines, for outputting "1" when the input column address Y<4;0> and the input RAM selection address Z<1;0> match up with programmed addresses Yi<4;0> and Zi<1;0> (i=0 to 6), i.e., FCiY0, FCiY1, FCiY2, FCiY3, FCiY4, FCiZ0, and FCiZ1, respectively, and reference numeral 21 denotes an AND gate for implementing a logical AND operation on FCiEN and an output of a corresponding address comparison circuit 20 intended for redundant column lines and for outputting an AND operation result HITCi (i=0 to 6). Therefore, seven address comparison circuits 20 intended for redundant column lines and seven AND gates 21 are disposed for the seven redundant column lines or c redundant zones. Furthermore, reference numeral 22 denotes an address encoder intended for redundant column lines, for generating an address ENCC<2;0> as a redundant RAM column address YR<2;0> to be applied to the redundant RAM 14 from the outputs HITC0 to HITC6 of the seven AND gates 21 associated with the seven redundant column lines and HITR described later, and reference numeral 23 denotes an OR gate for implementing a logical OR operation on HITC0 to HITC6 and for outputting an OR operation result HITC.

Reference numeral 24 denotes an address comparison circuit intended for redundant row lines, for outputting "1" when the eight highmost bits of the input row address X<8;1> and the input RAM selection address Z<1;0> match up with programmed addresses Xj<8;1> and Zj<1;0> (j=0 to 7), i.e., FRjX1, FRjX2, FRjX3, FRjX4, FRjX5, FRjX6, FRjX7, FRjX8, FRjZ0, and FRjZ1, respectively, and reference numeral 25 denotes an AND gate for implementing a logical AND operation on FRjEN and an output of a corresponding address comparison circuit 24 intended for redundant row lines and for outputting an AND operation result HITRj (j=0 to 7). Therefore, eight address comparison circuits 24 intended for redundant row lines and eight AND gates 25 are disposed for the eight redundant row lines or d redundant zones. Furthermore, reference numeral 26 denotes an address encoder intended for redundant row lines, for generating an address ENCR<2;0> from the outputs HITR0 to HITR7 of the AND gates 25 associated with the eight redundant row lines, and reference numeral 27 denotes an OR gate for implementing a logical OR operation on the outputs HITR0 to HITR7 and for outputting an OR operation result HITR.

In addition, reference numeral 28 denotes an OR gate for implementing a logical OR operation on HITC and HITR and for outputting an OR operation result as an NED signal. Therefore, the NED signal shows the logical OR of HITC0 to HITC6 and HITR0 to HITR7. Furthermore, reference numeral 29 denotes an address scrambling circuit (address scrambling means) for generating a redundant RAM row address XR<8;0> to be applied to the redundant RAM 14 from the input row address X<8;0>, the input column address Y<4;0> and the address ENCR<2;0> from the redundant row address encoder 26 according to a given address scramble table, reference numeral 30 denotes an inverter for inverting the NED signal, reference numeral 31 denotes an OR gate for implementing a logical OR operation on a CEC signal with a negative-true logic applied to the semiconductor memory and the output of the inverter 30, and for outputting an OR operation result, as a cell enable signal CECR (referred to as CECR signal from here on) intended for the redundant RAM, to the redundant RAM 14.

Furthermore, in FIG. 1, reference numeral 32 denotes a RAM selection decoder for decoding the input RAM selection address Z<1;0> and for asserting one of its four outputs so as to select one of RAM0, RAM1, RAM2, and RAM3, reference numeral 33a denotes an inverter for inverting the output 0 of the RAM selection decoder 32, reference numeral 34a denotes an OR gate for implementing a logical OR operation on the CEC signal, the NED signal, and the output of the inverter 33a, and for outputting an OR operation result, as a cell enable signal CECN (referred to CECN signal from here on) directed to RAM0, to RAM0, reference numeral 35a denotes a NOR gate for implementing a logical NOR operation on the NED signal and the output of the inverter 33a, and for outputting a NOR operation result, reference numeral 36a denotes a tri-state buffer (output control means) for outputting a 16-bit output DQN<15;0> from RAM0 only when the output of the NOR gate 35a is "1", reference numeral 33b denotes an inverter for inverting the output 1 of the RAM selection decoder 32, reference numeral 34b denotes an OR gate for implementing a logical OR operation on the CEC signal, the NED signal, and the output of the inverter 33b, and for outputting an OR operation result, as a CECN signal directed to RAM1, to RAM1, reference numeral 35b denotes a NOR gate for implementing a logical NOR operation on the NED signal and the output of the inverter 33b, and for outputting a NOR operation result, reference numeral 36b denotes a tri-state buffer (output control means) for outputting a 16-bit output DQN<15;0> from RAM1 only when the output of the NOR gate 35b is "1", reference numeral 33c denotes an inverter for inverting the output 2 of the RAM selection decoder 32, reference numeral 34c denotes an OR gate for implementing a logical OR operation on the CEC signal, the NED signal, and the output of the inverter 33c, and for outputting an OR operation result, as a CECN signal directed to RAM2, to RAM2, reference numeral 35c denotes a NOR gate for implementing a logical NOR operation on the NED signal and the output of the inverter 33c, and for outputting a NOR operation result, reference numeral 36c denotes a tri-state buffer (output control means) for outputting a 16-bit output DQN<15;0> from RAM2 only when the output of the NOR gate 35c is "1", reference numeral 33d denotes an inverter for inverting the output 3 of the RAM selection decoder 32, reference numeral 34d denotes an OR gate for implementing a logical OR operation on the CEC signal, the NED signal, and the output of the inverter 33d, and for outputting an OR operation result, as a CECN signal directed to RAM3, to RAM3, reference numeral 35d denotes a NOR gate for implementing a logical NOR operation on the NED signal and the output of the inverter 33d, and for outputting a NOR operation result, and reference numeral 36d denotes a tri-state buffer (output control means) for outputting a 16-bit output DQN<15;0> from RAM3 only when the output of the NOR gate 35d is "1".

In addition, reference numeral 37 denotes a tri-state buffer (output control means) for outputting a 16-bit output DQN<15;0> from the redundant RAM 14 only when the NED signal has a value of "1", and reference numeral 38 denotes a clock buffer for delaying a clock signal CLK applied to the semiconductor memory in consideration of delay times provided for various control signals generated by the control block 16.

As shown in FIGS. 1 and 2, the data output terminals of the four regular RAMs 13a to 13d are connected, by way of the respective tri-state buffers 36a to 36d, to a bus 39 connected to an output terminal (not shown in the figure) of the semiconductor memory. The data output terminal of the redundant RAM 14 is also connected to the bus 39. As a result, the sum total of the lenghts of data output lines can be shortened, and hence the chip area can be reduced. When the four regular RAMs 13a to 13d and the redundant RAM 14 are not connected to one another by way of the bus 39, it is necessary to concentrate the data output lines of the four regular RAMs 13a to 13d and the redundant RAM 14 to a point and to select one of their outputs by using a selector. In this case, a problem is therefore that the sum total of the lenghts of the data output lines increases. In contrast, the connections among the four regular RAMs 13a to 13d and the redundant RAM 14 by way of the bus 39 enables provision of one tri-state buffer in the vicinity of each single RAM, thus shortening the sum total of the lenghts of the data output lines.

In operation, when there is no defective element in any one of the four regular RAMs 13a to 13d, all single fuse blocks 19a and 19b within the fuse block 15, including the single fuse block 19a used for generation of one enable signal intended for redundant column lines, are not programmed. Thus the outputs of all the single fuse blocks 19a and 19b are always at state "0". Therefore, the NED signal, which is the logical OR of HITC0 to HITC6 and HITR0 to HITR7, is held at state "0" regardless of the input address.

The row address X<8;0> and the column address Y<4;0> included in the input address are applied directly to each regular RAM as the regular RAM row address XN<8;0> and the regular RAM column address YN<4;0>, respectively, as shown in FIG. 1. On the other hand, the RAM selection decoder 32 decodes the input RAM selection address Z<1; 0> and asserts one of its four outputs so as to select a corresponding one of the four regular RAMs, i.e., RAM0, RAM1, RAM2, and RAM3. The inverter 33a inverts the output 0 of the RAM selection decoder 32. The OR gate 34a implements a logical OR operation on the CEC signal of negative-true logic applied to the semiconductor memory, the NED signal, and the output of the inverter 33a, and then outputs an OR operation result as a CECN signal to RAM0. Similarly, the inverters 33b, 33c, and 33d invert the output 1, output 2, and output 3 of the RAM selection decoder 32, respectively. The OR gate 34b implements a logical OR operation on the CEC signal of negative-true logic applied to the semiconductor memory, the NED signal, and the output of the inverter 33b, and then outputs an OR operation result as a CECN signal to RAM1, the OR gate 34c implements a logical OR operation on the CEC signal of negative-true logic applied to the semiconductor memory, the NED signal, and the output of the inverter 33c, and then outputs an OR operation result as a CECN signal to RAM2, and the OR gate 34d implements a logical OR operation on the CEC signal of negative-true logic applied to the semiconductor memory, the NED signal, and the output of the inverter 33d, and then outputs an OR operation result as a CECN signal to RAM3.

Since the NED signal is always at state "0" when there is no defective element in any one of the four regular RAMs 13a to 13d, the CECN signal applied to each regular RAM is determined only by the values of the CEC signal and the input RAM selection address Z<0;1>. Therefore, when the CEC signal has a value of "1", the four regular RAMs 13a to 13d, i.e., all of RAM0, RAM1, RAM2, and RAM3 get deactivated. In contrast, when the CEC signal has a value of "0", one of the four regular RAMs 13a to 13d is selectively activated according to the output of the RAM selection decoder 32. Similarly, when only a corresponding one of the tri-state buffers 36a, 36b, 36c and 36d is enabled according to the NOR operation result signal from a corresponding one of the NOR gates 35a, 35b, 35c and 35d, which implements a logical NOR operation on a corresponding output of the RAM selection decoder 32 and the NED signal. In other words, only one tri-state buffer corresponding to one regular RAM selectively activated is similarly enabled selectively, and furnishes the output DQN<15;0> of the activated regular RAM. As a result, the semiconductor memory outputs the output DQN<15;0> from this regular RAM selectively activated as DQ<15;0>.

Since the tri-state buffer 37 used to deliver the output DQR<15;0> from the redundant RAM 14 is controlled by the NED signal, the output of the tri-state buffer 37 always has a high impedance when the NED signal is always at state "0". Furthermore, since the OR gate 31 implements a logical OR operation on the inversion of the NED signal and the CEC signal and outputs an OR operation result to the redundant RAM 14 as a CECR signal of negative-true logic, the CECR signal always has a value of "1" when the NED signal is always at state "0". Therefore, the redundant RAM 14 is held at a non-selection state in which the redundant RAM 14 is not selected.

As mentioned above, when there is no defective element in any one of the four regular RAMs 13a to 13d, the semiconductor memory acts as a 1 Mb RAM having a 64K words×16 bits structure without having to use the redundant RAM 14.

When there is a column defect in one regular RAM within the semiconductor memory, the defective column line is replaced by a redundant column line of the redundant RAM 14, e.g., a c redundant zone shown in FIG. 3. When replacing a column line defined by the input column address Y<4; 0>=Yi<4;0> and the input RAM selection address Z<1; 0>=Zi<1;0> with the ith redundant column line, fuses FCiEN, FCiYn, and FCiZm are programmed, where n and m are bit numbers which satisfy the following equations: Yi<n>=1 and Zi<m>=1 in the addresses Yi<4;0> and Zi<1; 0>. For example, when i=0, and Y0<4;0>=(00110) and Z0<1;0>=(01), n=1, 2, and m=0, and therefore the following four fuses: FC0EN, FC0Y1, FC0Y2, and FC0Z0 are programmed.

When there is a column defect in one regular RAM within the semiconductor memory, as mentioned above, and the input column address Y<4;0> and the input RAM selection address Z<1;0> match up with programmed addresses Yi<4; 0> and Zi<1;0>, respectively, the corresponding ith address comparison circuit 20 intended for redundant column lines outputs "1". Since the corresponding fuse FCiEN for generation of an enable signal is programmed, it always outputs "1". Therefore, when the ith address comparison circuit 20 intended for redundant column lines outputs "1", the hit signal HITCi becomes state "1". As a result, the combination of the OR gates 23, 27, and 28 implements a logical OR operation on HITC0 to HITC6 and HITR0 to HITR7 and then generates the NED signal at state "1". In addition, the OR gates 34a to 34d, which generate the CECN signals to be applied to the four regular RAMs 13a to 13d, respectively, all generates the CECN signals at state "1" based on the NED signal at state "1". Therefore, all of the four regular RAMs 13a to 13d enter a non-selection state. Furthermore, since the control signals applied to the tri-state buffers 36a to 36d which control the outputs DQN<15;0> of the four regular RAMs 13a to 13d, respectively, become state "0", all the outputs of the tri-state buffer 36a to 36d have high impedances. Therefore, no data is output from any one of the four regular RAMs.

On the other hand, since the inverter 30 outputs the inversion of the NED signal at state "1" to the OR gate 31, the OR gate 31 outputs the CECR signal of the same value as the CEC signal of negative-true logic to the redundant RAM 14. Therefore, the redundant RAM 14 enters a selection state in which it is selected according to the CECR signal. Furthermore, since the NED signal at state "1" is applied as the control signal to the tri-state buffer 37, the tri-state buffer 37 is enabled and then outputs the output data DQR<15;0> from the redundant RAM 14 as the output data DQ<15;0> of the semiconductor memory.

Figures 6, 7, 8:
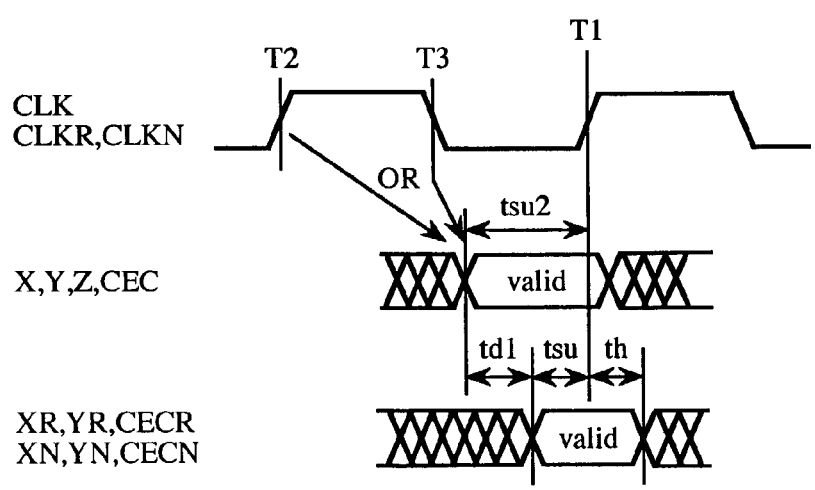
FIG. 6 is a table showing an address ENCC<2;0> generated by an address encoder intended for redundant column lines included in a control block of the semiconductor memory according to the first embodiment of the present invention.
FIG. 7 is a table showing an address ENCR<2;0> generated by an address encoder intended for redundant row lines included in the control block of the semiconductor memory according to the first embodiment of the present invention.
FIG. 8 is a timing chart showing input signals of the semiconductor memory and input signals of each regular RAM and the redundant RAM in the case that the control block of the semiconductor memory according to the first embodiment of the present invention includes no clock buffer.

In the case of column redundancy, the address scrambling circuit 29 generates the redundant RAM row address XR<8;0> to be applied to the redundant RAM 14 from the input row address X<8;0>. Concretely, the address scrambling circuit 29 connects the input row address X<8;0> to the redundant RAM row address XR<8;0> to be applied to the redundant RAM 14 according to the address scramble table shown in a "column redundancy" column in FIG. 5. The address ENCC<2;0> generated by the address encoder 22 intended for redundant column lines is directly connected to the redundant RAM column address YR<2;0> to be applied to the redundant RAM 14. The address ENCC<2;0> generated by the address encoder 22 intended for redundant column lines has possible values as shown in FIG. 6. FIG. 6 shows a relationship between the HITCi signal at state "1" and the generated address ENCC<2;0> when the HITCi signal associated with the ith (i=0 to 6) redundant column line is at state "1", and i expressed in the form of a binary number is equivalent to the address ENCC<2;0>. ENCC<2;0>=0 to 6 (in decimal number) are allocated to redundant column lines, and ENCC<2;0>=7 (in decimal number) is allocated to redundant row lines. Therefore, in the address space of the redundant RAM 14, the seven c redundant zones shown in FIG. 3 are allocated to the seven redundant column lines designated by i=0, 1, . . . , and 6, respectively.

When the input column address Y<4;0> and the input RAM selection address Z<1;0> do not match up with any programmed addresses Yi<4;0> and Zi<1;0>, respectively, any hit signal HITCi remains at state "0". As a result, the combination of the OR gates 23, 27, and 28 implements a logical OR operation on HITC0 to HITC6 and HITR0 to HITR7 and then generates the NED signal at state "0". At this time, if there is no row defect the semiconductor memory operates as in the case where there is no defective memory cell in any regular RAM.

As mentioned above, when there is a column defect in any one of the four regular RAMS, only the defective column line is logically replaced by a specific redundant column line of the redundant RAM 14, for example, a c redundant zone of FIG. 3. In other words, since the redundant RAM 14 has seven (i=0 to 6) redundant column lines, for example, seven c redundant zones shown in FIG. 3 and arbitrary addresses Yi<4;0> and Zi<1;0> can be programmed for each of the seven redundant column lines, it is possible to repair seven arbitrary defective column lines included in the four regular RAMs, i.e., RAM0, RAM1, RAM2, and RAM3 by replacing them with the seven redundant column lines.

When there is a row defect in one regular RAM within the semiconductor memory, the defective row line is replaced by a redundant row line of the redundant RAM 14, e.g., a d redundant zone shown in FIG. 3. When replacing two row lines (two row lines associated with X<0>=0,1) defined by the input row address X<8;1>=Xj<8;1> and the input RAM selection address Z<1;0>=Zi<1;0> with the jth redundant row line, fuses FRjEN, FRjXp, and FRjZq are programmed, where p and q are bit numbers which satisfy the following equations Xj<p>=1 and Zj<q>=1 in the addresses Xj<8;1> and Zj<1;0>. For example, when j=2, and X2<8;1>=(00001100) and Z2<1;0>=(10), p=3, 4, and q=1, and therefore the following four fuses: FR2EN, FR2X3, FR2X4, and FR2Z1 are programmed.

When there is a row defect in one regular RAM within the semiconductor memory, as mentioned above, and the input row address X<8;1> and the input RAM selection address Z<1;0> match up with programmed addresses Xj<8;1> and Zj<1;0>, respectively, the corresponding jth address comparison circuit 24 intended for redundant row lines outputs "1". Since the corresponding fuse FRjEN for generation of an enable signal is programmed, it always outputs "1". Therefore, when the jth address comparison circuit 24 intended for redundant row lines outputs "1", the hit signal HITRj becomes state "1". As a result, the combination of the OR gates 23, 27, and 28 implements a logical OR operation on HITC0 to HITC6 and HITR0 to HITR7 and then generates the NED signal at state "1". In addition, the OR gates 34a to 34d, which generate the CECN signals to be applied to the four regular RAMs 13a to 13d, respectively, all generates the CECN signals at state "1" based on the NED signal at state "1". Therefore, all of the four regular RAMs 13a to 13d enter a non-selection state. Furthermore, since the control signals applied to the tri-state buffers 36a to 36d which control the outputs DQN<15;0> of the four regular RAMs 13a to 13d, respectively, become state "0", all the outputs of the tri-state buffer 36a to 36d have high impedances. Therefore, no data is output from any one of the four regular RAMs.

On the other hand, since the inverter 30 outputs the inversion of the NED signal at state "1" to the OR gate 31, the OR gate 31 outputs the CECR signal of the same value as the CEC signal of negative-true logic to the redundant RAM 14. Therefore, the redundant RAM 14 enters a selection state in which it is selected according to the CECR signal. Furthermore, since the NED signal at state "1" is applied as the control signal to the tri-state buffer 37, the tri-state buffer 37 is enabled and then outputs the output data DQR<15;0> from the redundant RAM 14 as the output data DQ<15;0> of the semiconductor memory.

In the case of row redundancy, the address scrambling circuit 29 generates the redundant RAM row address XR<8;0> to be applied to the redundant RAM 14 from bit 0 of the input row address, i.e., X<0>, the input column address Y<4;0>, and the address ENCR<2;0> generated by the address encoder 26 intended for redundant row lines. Concretely, the address scrambling circuit 29 connects bit 0 of the input row address, i.e., X<0> to bit 0 of the redundant RAM row address, i.e., XR<0> to be applied to the redundant RAM 14, connects the input column address Y<4;0> to bits 1 to 5 of the redundant RAM row address, i.e., XR<5;1>, and connects the address ENCR<2;0> generated by the address encoder 26 intended for redundant row lines to bits 6 to 8 of the redundant RAM row address, i.e., XR<8;6>, according to the address scramble table shown in a "row redundancy" column in FIG. 5. As already mentioned, the address ENCC<2;0> generated by the address encoder 22 intended for redundant column lines is directly connected to the redundant RAM column address YR<2;0> to be applied to the redundant RAM 14. The address ENCR<2;0> generated by the address encoder 26 intended for redundant row lines has possible values as shown in FIG. 7. FIG. 7 shows a relationship between the HITRj signal at state "1" and the generated address ENCR<2;0> when the HITRi signal associated with the jth (j=0 to 7) redundant row line is at state "1", and j expressed in the form of a binary number is equivalent to the address ENCR<2;0>. Since the address encoder 22 intended for redundant column lines generates an address ENCC<2;0> with all bits set to 1 regardless of the value of the HITCi signal when the HITR signal is at state "1", as shown in FIG. 6, the redundant RAM column address YR<2;0>=(111)=7 (in decimal number). Therefore, in the address space of the redundant RAM 14, the eight d redundant zones shown in FIG. 3 are allocated to the eight redundant row lines designated by j=0, 1, . . . , and 7, respectively.

When the eight highmost bits of the input row address, i.e., X<8;1> and the input RAM selection address Z<1;0> do not match up with any programmed addresses Xj<8;1> and Zj<1;0>, respectively, all the hit signals HITRj remain at state "0". As a result, the combination of the OR gates 23, 27, and 28 implements a logical OR operation on HITC0 to HITC6 and HITR0 to HITR7 and then generates the NED signal at state "0". At this time, if there is no column defect the semiconductor memory operates as in the case where there is no defective memory cell in any regular RAM.

As mentioned above, when there is a row defect in any one of the four regular RAMs, only the defective row line is logically replaced by a specific redundant row line of the redundant RAM 14, for example, one d redundant zone shown in FIG. 3. Since the redundant RAM 14 has eight (j=0 to 7) redundant row lines, for example, eight d redundant zones shown in FIG. 3 and arbitrary addresses Xj<8;1> and zj<1;0> can be programmed for each of the eight redundant row lines, it is possible to repair eight pairs of two arbitrary defective row lines included in the four regular RAMs, i.e., RAM0, RAM1, RAM2, and RAM3 by replacing them with the eight redundant row lines, for example, the eight d redundant zones shown in FIG. 3.

It should be noted that the address scramble table for use in column redundancy as shown in FIG. 5 differs from that for use in row redundancy. Such performance of different address scrambling operations on column redundancy and row redundancy makes it possible to replace one or more defective row lines of one regular RAM with one or more redundant zones having a shape different from that of the one or more defective row lines, but having the same area as the one or more defective row lines, and to combine a plurality of redundant zones corresponding to a plurality of redundant column lines and a plurality of redundant zones corresponding to a plurality of redundant row lines into a single rectangular area. This means that not only the column replacement but also the row replacement can be implemented by using only one redundant RAM 14. In other words, it is possible to replace defective column lines and defective row lines with redundant memory elements within the single redundant RAM 14 disposed independently of the four regular RAMs 13a to 13d with efficiency so as to repair them.

When there is a single bit defect in any one of the four regular RAMs, it is possible to replace the defective bit with either a redundant column line or a redundant row line.

When there is a row defect and a column defect in a regular RAM and the input address match up with the address at the intersection of these row defect and column defect, both the HITC signal and the HITR signal become state "1". In preparation for this case, priorities are assigned to the plurality of redundant row lines and the plurality of redundant column lines. For example, a higher priority is given to the plurality of redundant row lines than to the plurality of redundant column lines, and the address encoder 22 intended for redundant column lines and the address scrambling circuit 29 are logically designed to generate outputs similar to those in the case where the HITR signal is at state "1" regardless of whether or not the HITC signal is at state "1" when the HITR signal becomes state "1". Since the priority assignment is a design matter to prevent the occurrence of errors, the semiconductor memory of the present invention works without any trouble even if a higher priority is given to the plurality of redundant column lines than to the plurality of redundant row lines.

Some time is necessary for the above-mentioned control operation to replace either a defective column line or a defective row line with either a redundant column line or a redundant row line. Therefore, it is necessary to provide some delay time for the control block 16. It is preferable that the control block 16 peforms control operations within an input setup time period during which inputs applied to the entire semiconductor memory are set up.

FIG. 8 is a timing chart showing input signals applied to the semiconductor memory and input signals applied to each regular RAM and the redundant RAM 14 when the semiconductor memory does not include the clock buffer 38. The input signals, such as the address signals, respectively applied to the four regular RAMs 13a to 13d and the redundant RAM 14 have to have a setup time tsu and a hold time th in accordance with a certain standard with respect to a rising time T1 of a clock signal CLK (abbreviated as CLK signal from here on, clock signals CLKN and CLKR are the same as the CLK signal when there is no clock buffer 38). In general, the setup time tsu and the hold time th are very shorter than 1 cycle of the CLK signal. On the other hand, because of the delay of the control block 16, the regular RAM row address XN<8;0>, the regular RAM column address YN<4;0>, and the CECN signal input to each of the four regular RAMS 13a to 13d are delayed with respect to the input row address X<8;0>, the inut column address Y<4;0>, the input RAM selection address Z<1;0>, and the CEC signal input to the semiconductor memory which acts as a 1 Mb RAM. Similarly, the redundant RAM row address XR<8;0>, the redundant RAM column address YR<4;0>, and the CECR signal input to the redundant RAM 14 are delayed with respect to the input row address X<8;0>, the input column address Y<4;0>, the input RAM selection address Z<1;0>, and the CEC signal. Furthermore, in consideration of variations in the above-mentioned delay times, the time required for identification of the logical values of the input signals, such as the address signals, input to each single RAM is set to be shorter than that required for identification of the logical values of the input signals, such as the address signals, input to the entire semiconductor memory.

To solve this problem, it is preferable that the input row address X<8;0>, the input column address Y<4;0>, the input RAM selection address Z<1;0>, and the CEC signal are applied to the semiconductor memory so that the logical values of the input signals, such as the address signals, input to the entire semiconductor memory are identified in synchronization with either a rising time T2 or a falling time T3 of a clock pulse prior to the rising time T1 which defines the input timing of the input signals, such as the address signals, input to each single RAM, and those logical values are held until T1. When the input row address X<8;0>, the input column address Y<4;0>, the input RAM selection address Z<1;0>, and the CEC signal are applied to the semiconductor memory in synchronization with the falling time T3 of a clock pulse prior to the rising time T1, the following equation: ta+td1+tsu=(½ cycles of the CLK signal) is established, where ta is a delay time between T3 and the instant when the input addresses X<8;0>, Y<4;0>, and Z<1;0>, and the CEC signal become valid. Therefore, reductions in ta and tsu can increase td1 to the order of ½ cycles of the CLK signal. On the other hand, when the input row address X<8;0>, the input column address Y<4;0>, the input RAM selection address Z<1;0>, and the CEC signal are applied to the semiconductor memory in synchronization with the rising time T2 of a clock pulse prior to the rising time T1, the following equation: tb+td1+tsu=(1 cycle of the CLK signal) is established, where tb is a delay time between T2 and the instant when the input addresses X<8;0>, Y<4;0>, and Z<1;0>, and the CEC signal become valid. Therefore, reductions in tb and tsu can increase td1 to the order of 1 cycle of the CLK signal.

Thus the input row address X<8;0>, the input column address Y<4;0>, the input RAM selection address Z<1;0>, and the CEC signal are applied to the semiconductor memory so that the logical values of the input signals, such as the address signals, input to the entire semiconductor memory are validated in synchronization with either the rising time T2 or the falling time T3 of a clock pulse prior to the rising time T1 which defines the input timing of the input signals, such as the address signals, input to each single RAM, and those logical values are held until T1. As a result, it is possible to ensure time of the order of 1 cycle or ½ cycles of the CLK signal as the delay time of the control block 16 without lengthening the cycle time of the CLK signal. Furthermore, since the control operation of the control block 16 during the input setup time period tsu2 of the entire semiconductor memory before T1, and accesses to single RAMs and outputs of the entire semiconductor memory after T1 can be pipeline-processed, it is possible to ensure the delay time of the control block 16 without lengthening the cycle time of the CLK signal. As a result, the time required to validate the logical values of the input signals applied to each single RAM can be lengthened.

Figure 9:
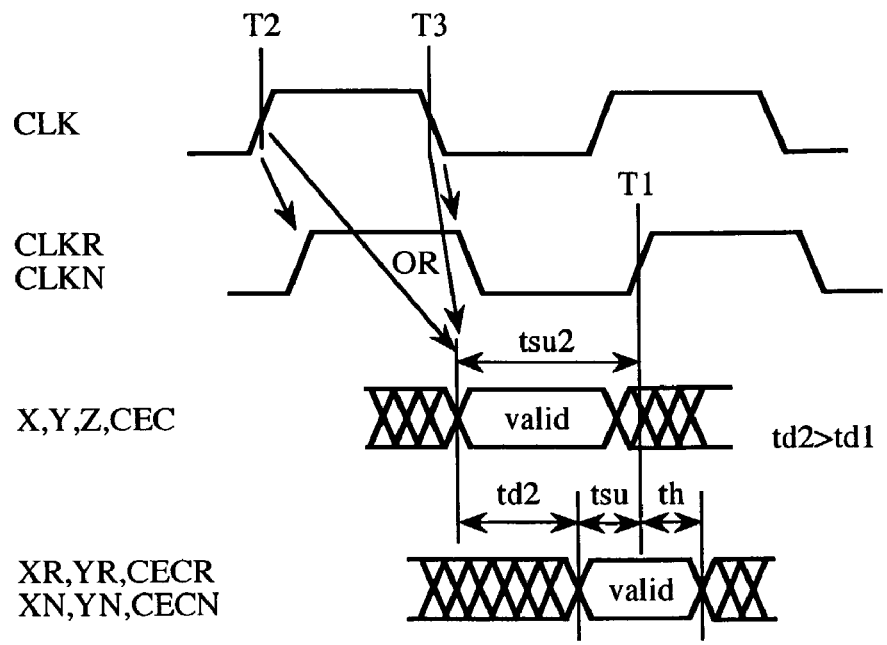
FIG. 9 is a timing chart showing input signals of the semiconductor memory and input signals of each regular RAM and the redundant RAM in the case that the control block of the semiconductor memory according to the first embodiment of the present invention includes a clock buffer.

The clock buffer 38 enables a delay time td2 longer than the delay time td1 shown in FIG. 8 to be ensured in the control block 16. FIG. 9 is a timing chart showing the input signals applied to the semiconductor memory and the input signals applied to the four regular RAMs and the redundant RAM in this case. The clock buffer 38 generates clock signals CLKN and CLKR to be supplied to the four regular RAMs and the redundant RAM by delaying the CLK signal applied to the semiconductor memory. Even in thisc ase, the input row address X<8;0>, the input column address Y<4; 0>, the input RAM selection address Z<1;0>, and the CEC signal are applied to the semiconductor memory so that the logical values of the input signals, such as the address signals, input to the entire semiconductor memory are validated in synchronization with either the rising time T2 or the falling time T3 of a clock pulse prior to the rising time T1 which defines the input timing of the input signals, such as the address signals, input to each single RAM, and those logical values are held until T1. Therefore, a delay time td2, which is longer than the delay time td1 shown in FIG. 7 only by the delay time caused by the clock buffer 38, can be ensured in the control block 16. As a result, the time required to validate the logical values of the input signals applied to each single RAM can be lengthened.

It is preferable that the clock buffer 38 is disposed within the control block 16, as shown in FIG. 1. As a result, a dealy caused by wiring provided for the input signals, such as the address signals, applied to each single RAM can be made to be equal to that caused by wiring provided for the clock signals CLKN and CLKR.

Next, the description will be directed to examples of a floor plan showing a physical arrangement of main components on the chip of the semiconductor memory according to the first embodiment of the present invention with reference to FIGS. 10 to 15.

Figure 10:
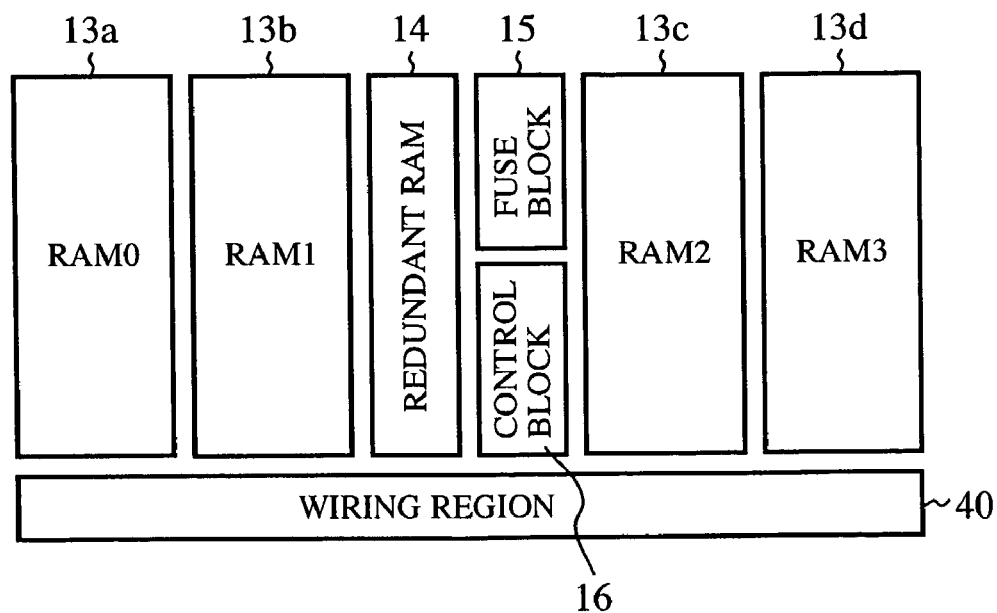
FIG. 10 is a diagram showing one example of a floor plan of the semiconductor memory according to the first embodiment of the present invention.

FIG. 10 shows a floor plan in which the two regular RAMs 13a and 13b, the redundant RAM 14, an area that consists of the fuse block 15 and the control block 16, and the two remaining regular RAMs 13c and 13d are aligned in a horizontal row. In this example, the length of one side of the redundant RAM 14 is equal to or nearly equal to the length of one side of each regular RAM. A wiring area 40 is an area where wiring intended for connections among the four regular RAMs 13a to 13d, the redundant RAM 14, and the control block 16, and wiring intended for connections among them and external units are arranged. The tri-state buffers 36a to 36d and 37 as shown in FIG. 1 can be arranged within the wiring region 40 rather than the control block 16 so that they are spread out over the wiring region. In this case, the length of wiring required for output data from each single RAM can be shortened. As an alternative, a RAM provided with a built-in tri-state buffer can be used as each of the four regular RAMs and the redundant RAM. In this case, the tri-state buffers 36a to 36d and 37 as shown in FIG. 1 become unnecessary. Since in the floor plan shown in FIG. 10 the number of row lines of the redundant RAM 14 is the same as the number of row lines of each of the four regular RAMs 13a to 13d, the length of one vertical side of the physical memory cell array of the redundant RAM 14 is also the same as the length of one vertical side of the physical memory cell array of each regular RAM and the floor plan is a compact one without any useless region.

Figure 11:
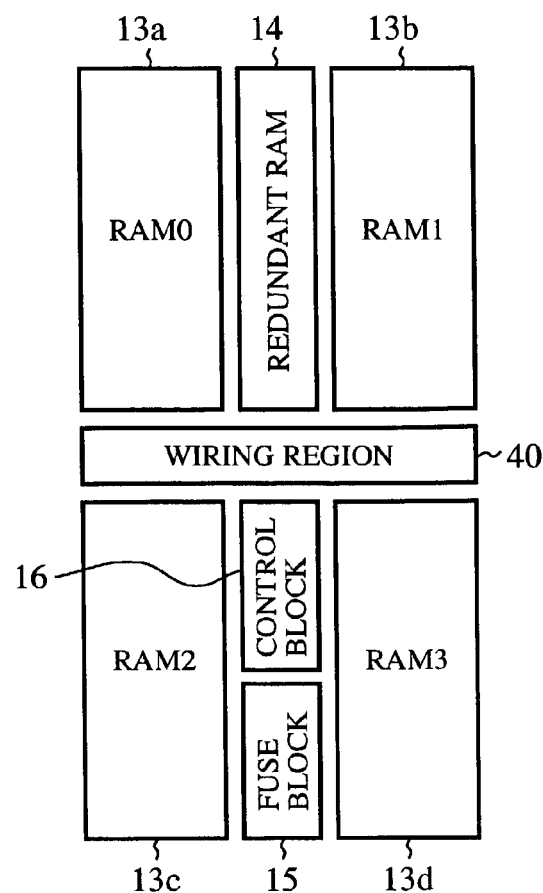
FIG. 11 is a diagram showing another example of the floor plan of the semiconductor memory according to the first embodiment of the present invention.

FIG. 11 shows a floor plan in which a wiring region 40 is sandwiched between two regions, and the regular RAM 13a, the redundant RAM 14, and the regular RAM 13b are aligned in a horizontal row within one of the two regions while the regular RAM 13c, an area that consists of the fuse block 15 and the control block 16, and the the regular RAM 13d are aligned in a horizontal row within the other region. The two regular RAMs 13a and 13b are arranged so that they are symmetric to the other two regular RAMs 13c and 13d with respect to the wiring region 40. In the floor plan shown in FIG. 11, the length of wiring between the control block 16 and each single RAM is shorter and is more uniform than that of wiring between the control block 16 and each single RAM as shown in FIG. 10. Furthermore, as in the case of the floor plan of FIG. 10, the tri-state buffers 36a to 36d and 37 as shown in FIG. 1 can be arranged within the wiring region 40 rather than the control block 16 so that they are spread out over the wiring region. In this case, the length of wiring required for output data from each single RAM can be shortened. As an alternative, a RAM provided with a built-in tri-state buffer can be used as each of the four regular RAMs and the redundant RAM. In this case, the tri-state buffers 36a to 36d and 37 as shown in FIG. 1 become unnecessary.

It is possible to select either the floor plan of FIG. 10 or the floor plan of FIG. 11 according to the shape of a place where the semiconductor memory is installed. In other words, when the place where the semiconductor memory is installed is a horizontally oriented one, the floor of FIG. 10 is adopted, whereas when the place where the semiconductor memory is installed is a vertically oriented one, the floor of FIG. 11 is adopted.

Figure 12:
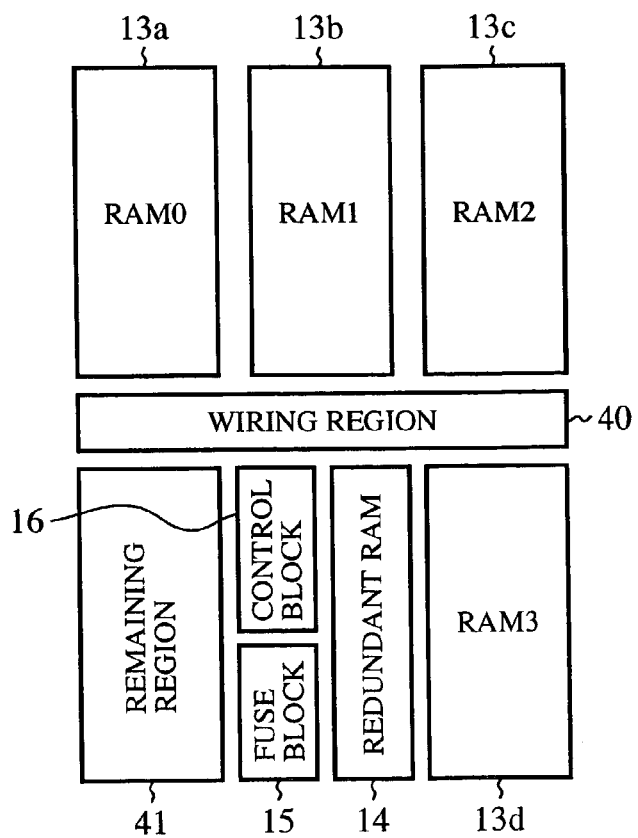
FIG. 12 is a diagram showing another example of the floor plan of the semiconductor memory according to the first embodiment of the present invention.

FIG. 12 shows a floor plan in which a wiring region 40 is sandwiched between two regions, and the three regular RAMs 13a to 13c are aligned in a horizontal row within one of the two regions, while the remaining regular RAM 13d, the redundant RAM 14, an area that consists of the fuse block 15 and the control block 16, and a remaining area 41, are aligned in a horizontal row within the other region. This floor plan has a width which stands midway between the widths of the floor plans shown in FIGS. 10 and 11. In this floor plan, the region occupied by the entire semiconductor memory is nearly a square. The remaining region 41 is disposed to enable arrangement of another RAM, a logical circuit, or an analog circuit therein and therefore the layout efficiency of the entire semiconductor chip can be maintained. In this case, when CAD for arrangement and wiring is' performed, if both such components within the semiconductor memory as each single RAM, the fuse block 15, and the control block 16, and the remaining region 41 are laid out on the same hierarchy, no restriction is imposed on the selection of a CAD tool. Furthermore, as in the case of the floor plan of FIG. 10, the tri-state buffers 36a to 36d and 37 as shown in FIG. 1 can be arranged within the wiring region 40 rather than the control block 16 so that they are spread out over the wiring region. In this case, the length of wiring required for output data from each single RAM can be shortened. As an alternative, a RAM provided with a built-in tri-state buffer can be used as each of the four regular RAMs and the redundant RAM. In this case, the tri-state buffers 36a to 36d and 37 as shown in FIG. 1 become unnecessary.

Figure 13:
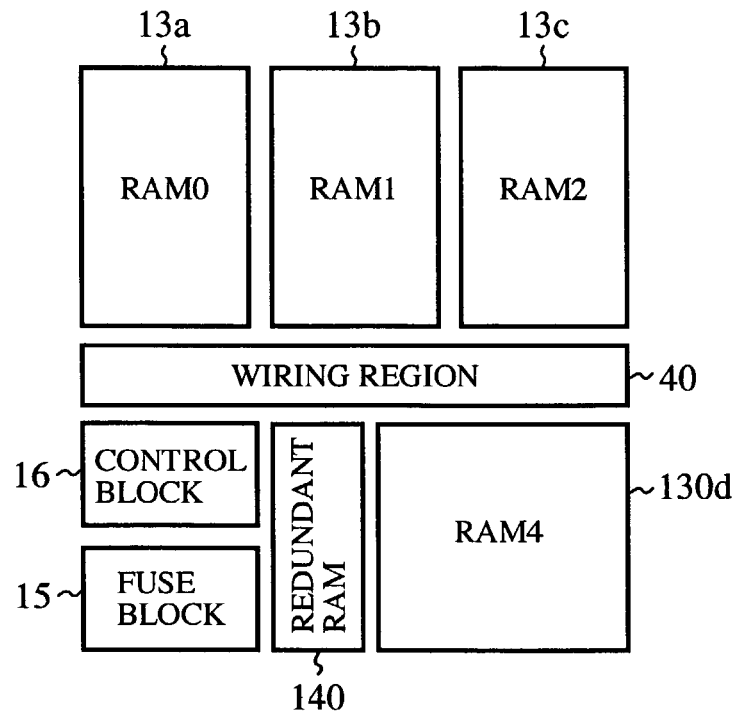
FIG. 13 is a diagram showing another example of the floor plan of the semiconductor memory according to the first embodiment of the present invention.

FIG. 13 shows a floor plan in which a wiring region 40 is sandwiched between two regions, as in the case of FIG. 12, and the three regular RAMs 13a to 13c are aligned in a horizontal row within one of the two regions while a remaining regular RAM 130d, a redundant RAM 140, and an area that consists of the fuse block 15 and the control block 16 are aligned in a horizontal row within the other region. In this floor plan, the regular RAM 130d is a regular memory cell array with 256 rows and 1,024 columns, and the redundant RAM 140 is a memory cell array with 256 rows and 256 columns. The redundant RAM 140 includes a memory cell array unit with 256 rows and 16 columns, as shown in FIG. 4, per 1 bit (i.e., per 1 block). The floor plan of FIG. 13 has the same width as the floor plan shown in FIG. 12, but has a vertical length which is shorter than that of the floor plan of FIG. 12 because there is no remaining region. In this case, the address scrambling circuit 29 generates an address for specifying one e redundant zone or f redundant zone of the redundant RAM 140 by which either a defective column line or a defective row line is replaced according to an address scramble table shown in FIG. 16. Furthermore, the semiconductor memory has an address scrambling circuit intended for regular RAMs not shown in FIG. 1. By using the address scrambling circuit the semiconductor memory connects the least significant bit of the input row address, i.e., X<0> to the least significant bit of a regular RAM column address, i.e., YNb<0> to be applied to the horizontally oriented regular RAM 130d, connects the remaining bits of the input row address, i.e., X<8;1> to bits 0 to 7 of a regular RAM row address, i.e., XNb<7;0> to be applied to the horizontally oriented regular RAM 130d, and connects the bits 0 to 3 to input column address Y<3;0> to the remaining bits of the regular RAM column address, i.e., YNb<4;1> according to an address scramble table shown in FIG. 17. As a result, one zone of the regular RAM 130d which is a target of row replacement is a portion with 1 row and 32 adjacent columns (per 1 bit), and one zone of the regular RAM 130d which is a target of column replacement is a portion with 256 adjacent rows and 2 adjacent columns (per 1 bit). A column defect often occurs in a pair of two adjacent column lines. For example, a column defect occurs due to a short in two bit lines between two adjacent column lines. Therefore, in the floor plan shown in FIG. 13, since a pair of two adjacent column lines of the regular RAM 130d where a defect occurs can be replaced by an arbitrary redundant column line of the redundant RAM 140 at a time, it is possible to do replacement with a high degree of efficiency, thereby improving yields. Furthermore, as in the case of the floor plan of FIG. 10, the tri-state buffers 36a to 36d and 37 as shown in FIG. 1 can be arranged within the wiring region 40 rather than the control block 16 so that they are spread out over the wiring region. In this case, the length of wiring required for output data from each single RAM can be shortened. As an alternative, a RAM provided with a built-in tri-state buffer can be used as each of the four regular RAMs and the redundant RAM. In this case, the tri-state buffers 36a to 36d and 37 as shown in FIG. 1 become unnecessary.

By the-way, when the address scrambling circuit intended for regular RAMs not shown in the figure connects the most significant bit of the input row address, i.e., X<8> to the least significant bit of the regular RAM column address, i.e., YNb<0> to-be applied to the regular RAM 130d according to-another address scramble table shown in FIG. 18, the target of the row replacement of the regular RAM 130d is two discrete zones. Since in general a defective row line is defective over the entire of the row line, two redundant row lines specified by X<8>=0 and X<8>=1 are needed to repair the defective row line and the efficiency is therefore reduced.

Figure 14:
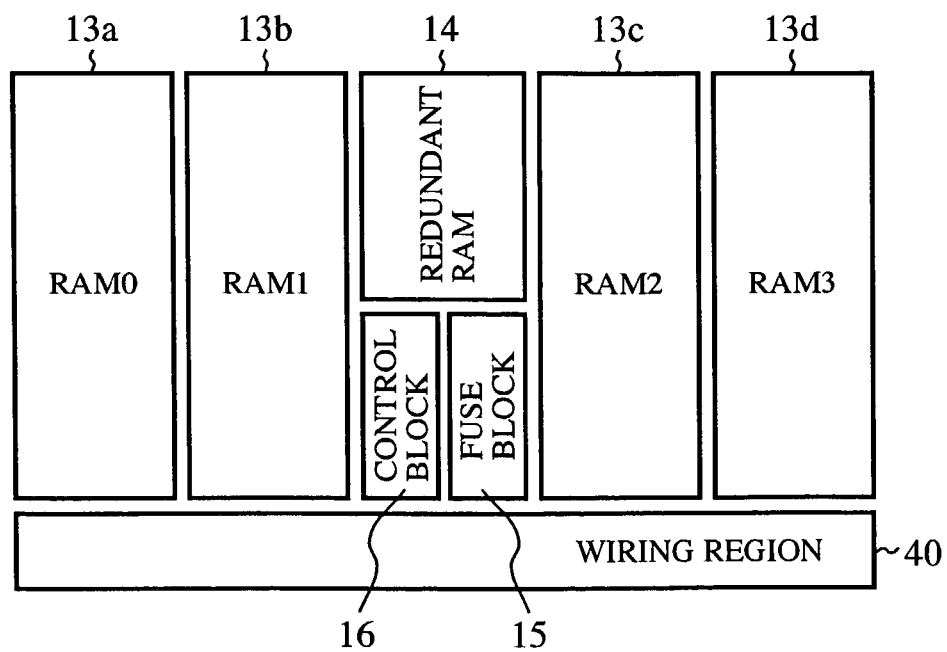
FIG. 14 is a diagram showing another example of the floor plan of the semiconductor memory according to the first embodiment of the present invention.

FIG. 14 shows a floor plan in which the two regular RAMs 13a and 13b, an area that consists of the redundant RAM 14, the fuse block 15, and the control block 16, and the two remaining regular RAMs 13c and 13d are aligned in a horizontal row. Unlike the floor plan of FIG. 10, the legnths of two perpendicular sides of the redundant RAM 14 are shorter than those of each regular RAM and the length of one vertical side of the area which is the combination of the redundant RAM 14, the fuse block 15, and the control block 16 is equal to or nearly equal to that of one vertical side of each regular RAM.

Figures 15, 16:
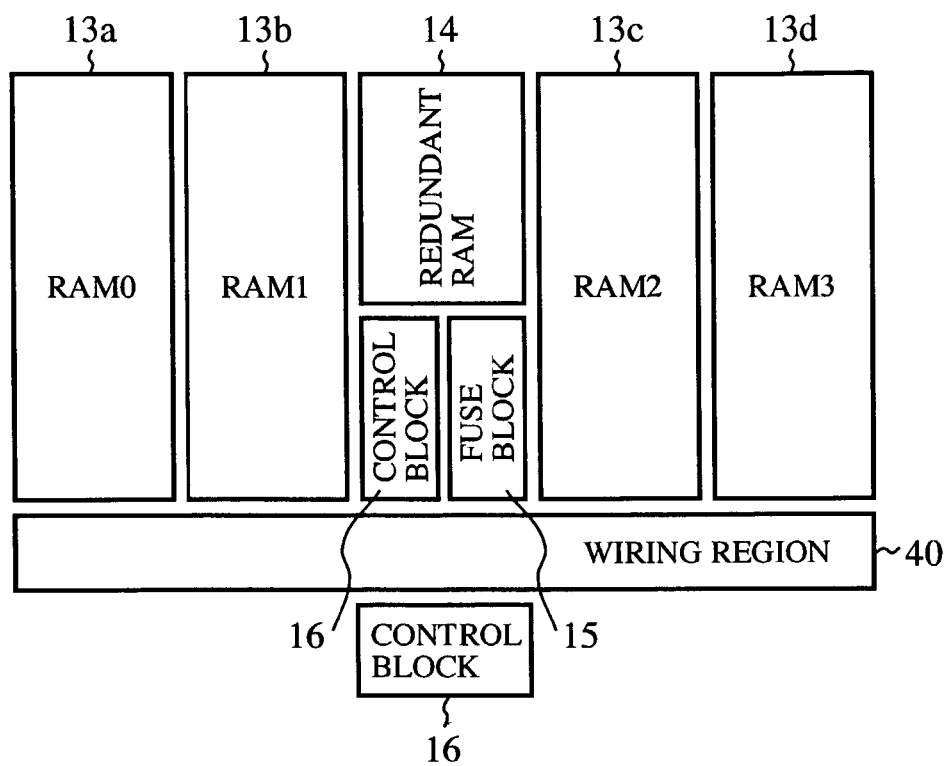
FIG. 15 is a diagram showing another example of the floor plan of the semiconductor memory according to the first embodiment of the present invention.
FIG. 16 is a table showing an address scramble table intended for the redundant RAM in the case of, column redundancy and row redundancy in the semiconductor memory according to the first embodiment of the present invention when the redundant RAM has a memory cell array shown in FIG. 4 in the floor plan shown in FIG. 13.

The length of one vertical side of the area which is the combination of the redundant RAM 14, the fuse block 15, and the control block 16 is not necessarily equal to or nearly equal to that of one vertical side of each regular RAM. As previously mentioned, the tri-state buffers 36a to 36d and 37 as shown in FIG. 1 can be arranged within the wiring region 40 rather than the control block 16 so that they are spread out over the wiring region. In this case, the area which is the combination of the redundant RAM 14, the fuse block 15, and the control block 16 does not include part of the control block 16. Another floor plan as shown in FIG. 15 can be provided. When, it is impossible to arrange the control block 16 as shown in FIG. 14, the control block 16 can be arranged as shown in FIG. 15. In this case, the length of one vertical side of an area which is a combination of the redundant RAM 14, the fuse block 15, and a part of the control block 16 is equal to or nearly equal to that of one vertical side of each regular RAM.

As can be seen from the above-mentioned floor plans as shown in FIGS. 10 to 15, the control block 16 is arranged in a space between one or two single RAMs and the fuse block 15. Since the shape of a final floor plan is adjusted by adjustment of the shape of the control block 16 when producing a floor plan, the shape of the control block 16 has to be provided with flexibility. Furthermore, when the scale and word structure of the entire semiconductor memory change, since the best scale of the redundant RAM changes according to the maturity level of the mass production technology even if the redundant RAM has the same word structure, it is also necessary to provide the control block 16 with flexibility in the light of the logical circuit. In other words, the number of bits and the number of words of each regular RAM, the number of regular RAMs, the number of bits and the number of words of the redundant RAM, the shape of the first redundant zone (for example, c redundant zone of FIG. 3), the number of the first redundant zones, the shape of the second redundant zone (for example, d redundant zone of FIG. 3) and the number of the second redundant zones, and so on can be enumerated as parameters which define the specification of the control block 16. It is preferable that such a lot of parameters can be optimized according to changes in the scale and word structure of the entire semiconductor memory. In general, since while in a RAM peripheral circuits are arranged repeatedly and regularly with a memory cell array being a core, the control block 16 does not have any element which becomes a core of regularity, a desired layout cannot be provided only by changing the number of repetitions.

A good-quality floor plan can be provided in a short design time by using a design method of pre-describing functions of the control block 16 in a format in which they can be logically synthesized, correcting the description of the functions in the format so that it is suitable for an optimized redundant RAM every time the semiconductor chip is designed, and designing the semiconductor memory through logic synthesis which uses standard logic macrocells and automatic arrangement wiring. In addition, by combining the design method and a method of generating a single RAM with a module generator, the design of the entire semiconductor memory performed for each semiconductor chip can be nearly automated, thereby greatly shortening the time required for the design of the semiconductor memory.

As mentioned above, in accordance with the first embodiment of the present invention, the semiconductor memory is provided with four regular RAMs 13a to 13d, a redundant RAM 14 disposed independently of these regular RAMs 13a to 13d, a redundant RAM 14 containing redundant zones by which defective zones of the four regular RAMs can be replaced, the fuse block 15 for specifying several kinds of defective zones with different shapes which are to be replaced by redundant zones, and a control block 16 for determining whether or not an address applied thereto is associated with a defective zone specified by the fuse block 15, for selecting one of the four regular RAMS 13a to 13d and the redundant RAM 14 according to a determination result from the control block 16, and for reading data from a location of one selected RAM, which is specified by the address, so as to output-the data, the control block 16 including an address scrambling circuit 29 for, to repair a defective zone of one regular RAM, generating an address to specifying a redundant zone of the redundant RAM by which the defective zone is to be replaced according to a different address scramble table which depends on the shape of the defective zone. Consequently, the semiconductor memory can repair several kinds of defective zones of different shapes by replacing them with corresponding redundant zones within the redundant RAM 14, respectively. In other words, the semiconductor memory can replace defective column lines and defective row lines with redundant zones by using the single redundant RAM 14 disposed independently of the four regular RAMs 13a to 13d with efficiency so as to repair them. Therefore, the provision of the redundant RAM disposed independently of the four regular RAMs can reduce a time period required for designing the entire semiconductor memory again followed by a change in the structure of the regular RAM cell array, especially a time period required for the layout design as compared with the prior art, thus decreasing the design cost. In addition, since an arbitrary plurality of defective column lines and an arbitrary plurality of defective row lines within the four regular RAMs 13a to 13d can be repaired, yields can be improved.

Furthermore, the data output terminal of each regular RAM and the data output terminal of the redundant RAM 14 is connected to each other by way of a bus 39, and the control block 16 is so constructed as to furnish a data output of each single RAM, by way of the bus 39, to outside the semiconductor memory, by only controlling a corresponding tri-state buffer disposed for each single RAM. As a result, the structure of the control block 16 is simplified.

In addition, as shown in the examples of FIGS. 10 to 15 of the floor plan of the semiconductor memory according to the first embodiment, it is possible to produce an optimized floor plan while maintaining the layout efficiency of the semiconductor chip and reducing the chip area according to the shape, layout, and so on of the semiconductor chip. Furthermore, a good-quality floor plan can be provided in a short design time by using a design method of pre-describing functions of the control block 16 in a format in which they can be logically synthesized, correcting the description of the functions in the format so that it is suitable for an optimized redundant RAM every time the semiconductor chip is designed, designing the semiconductor memory through logic synthesis which uses standard logic macrocells and automatic arrangement wiring.

Embodiment 2.

A semiconductor memory according to a second embodiment of the present invention is so constructed as to replace defective cluster bits each having 4 rows and 4 columns with redundant cluster bits in addition to replacement of defective column lines and defective row lines. Of course, the shape of each defective cluster bit is not limited to a one with 4 rows and 4 columns and each defective cluster bit can be an arbitrary zone which contains two or more memory cells.

Figure 19:
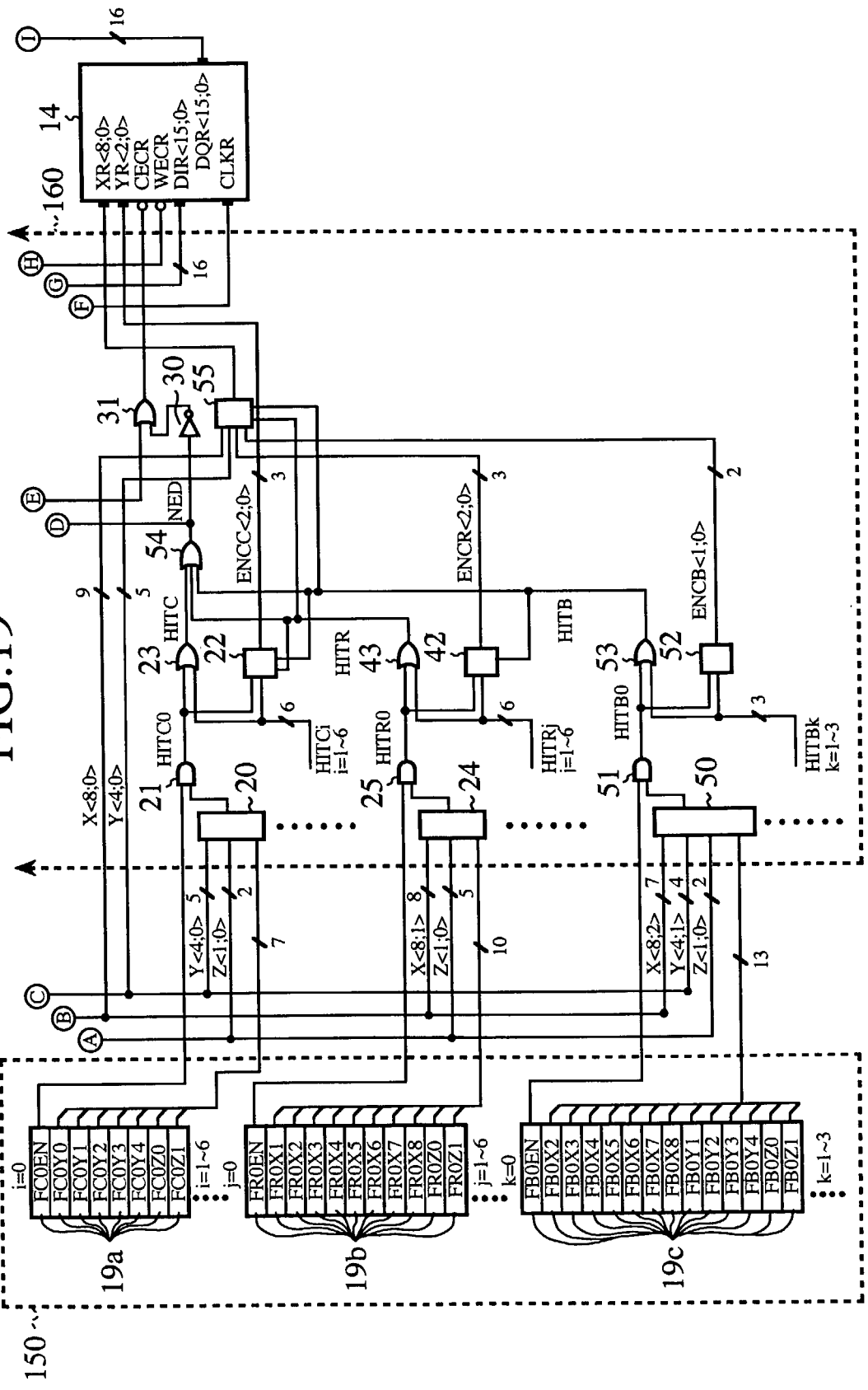
FIG. 19 is a block diagram showing the structure of a redundant RAM and peripheral circuits of a semiconductor memory according to a second embodiment of the present invention.

FIG. 19 is a block diagram showing the structure of a main part of a control block 160 and a fuse block 150 of the semiconductor memory according to the second embodiment of the present invention. The semiconductor memory according to the second embodiment has the same components as those of the semiconductor memory according to the above-mentioned first embodiment shown in FIG. 1 except the components shown in FIG. 19, and therefore the explanation of the same components will be omitted hereafter. Furthermore, in FIG. 19, the same reference numerals as shown in FIG. 2 denote components which are the same as those of the above-mentioned first embodiment shown in FIG. 1, and therefore the explanation of those components will be omitted hereafter. The semiconductor memory according to the second embodiment of the present invention can be a 1 Mb RAM with a 64K words×16 bits structure, but is not limited to such a RAM.

Figure 20:
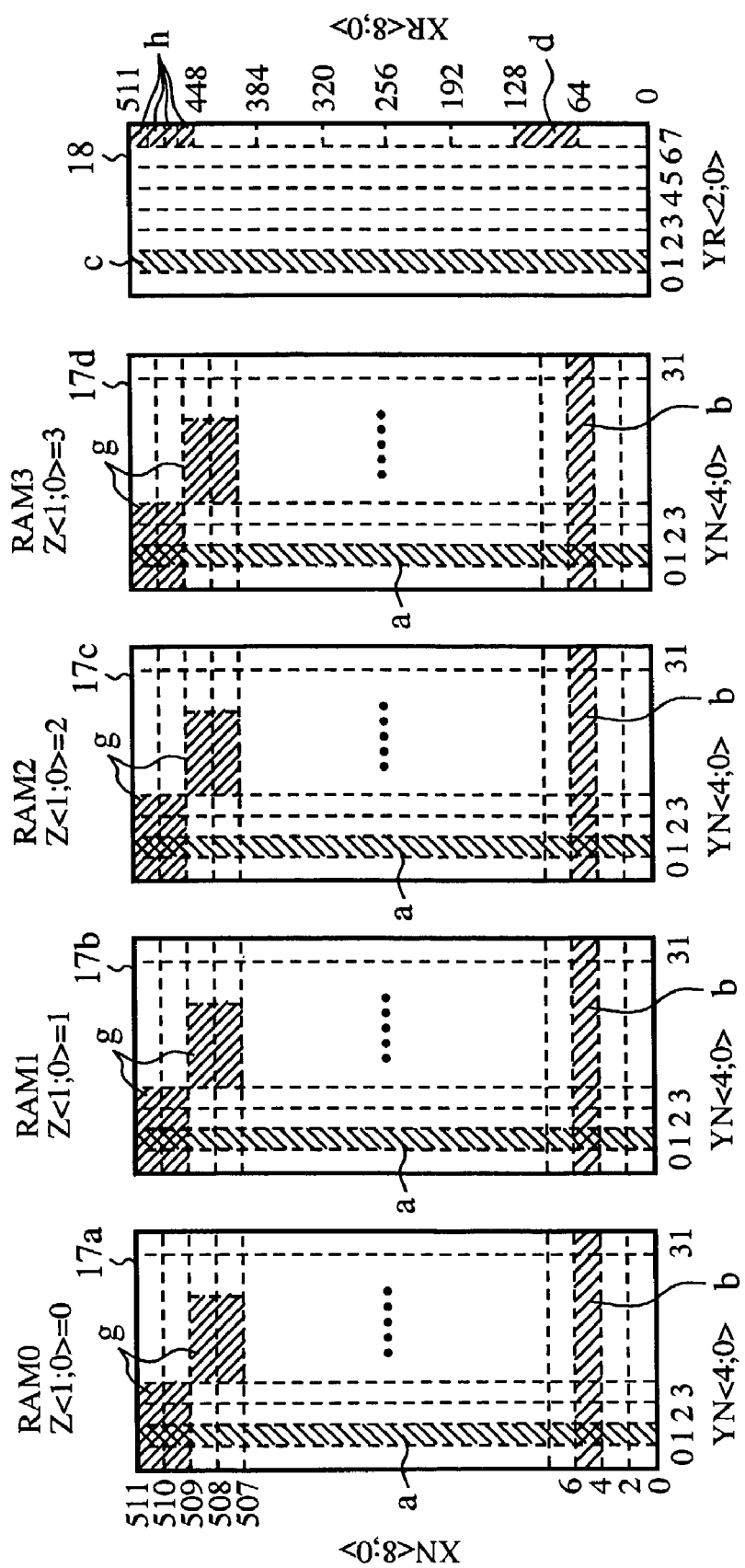
FIG. 20 is a diagram showing replacement mapping between memory elements, which are targets to be replaced in each regular RAM, and redundant memory elements of the redundant RAM in the semiconductor memory according to the second embodiment of the present invention.

FIG. 20 is a diagram showing a replacement mapping between memory zones each of which is a target of a regular RAM, which is to be replaced by a redundant memory element of a redundant RAM 14, and redundant memory elements. For simplicity of the drawing, FIG. 20 shows only 1-bit unit (i.e., 1 block) for each regular RAM and also shows only 1-bit unit for the redundant RAM 14. In FIG. 20, the same reference numerals and symbols as shown in FIG. 3 denote components which are the same as those of the above-mentioned first embodiment, and therefore the explanation of those components will be omitted hereafter.

The semiconductor memory according to the second embodiment includes 128 a zones, which are first targets to be replaced and have the same shape as those of the semiconductor memory according to the above-mentioned first embodiment, and 1,024 b zones, which are second targets to be replaced and have the same shape as those of the semiconductor memory according to the above-mentioned first embodiment, per 1 bit. As previously mentioned, while in the case of column replacement of a defective a zone with a c redundant zone of a 1-bit memory cell array unit 18 of the redundant RAM 14, 16 corresponding independent a zones each having 512 rows×1 column are replaced by 16 c redundant zones at the same time, in the case of row replacement of a defective b zone with a d redundant zone of a 1-bit memory cell array unit 18 of the redundant RAM 14, one consecutive zone with 2 rows and 512 columns that extends over two memory arrays of one regular RAM with a decoder being between the two memory arrays (i.e., 16 consecutive b zones) is replaced by 16 d redundant zones at the same time.

In addition, as shown in FIG. 20, each of 1-bit memory cell array units 17a, 17b, 17c, and 17d each with 512 rows and 32 columns of the four regular RAMs is divided into a plurality of g zones. Each g zone is a third taget to be replaced in the case of cluster bit replacement, and, as previously mentioned, has a size of 4 rows and 4 columns. For the four regular RAMs with 64K words, there are 4,096 g zones per bit. Each 1-bit memory cell array unit 18 of the redundant RAM 14 has 512 rows and 8 columns, and is logically divided into a plurality of redundant zones which are extending vertically and horizontally by broken lines as shown in the figure. Each third redundant zone (h redundant zone) vertically oriented is a target by which a defective zone of one regular RAM can be replaced, and has a size of 16 rows×1 column. The redundant RAM 14 includes seven c redundant zones, seven d redundant zones, and four h redundant zones per bit, in the example shown in FIG. 20. Therefore, in the structure as shown in FIG. 20, seven arbitrary defective column lines which reside in the four regular RAMs can be replaced by the seven c redundant zones, seven arbitrary defective row lines which reside in the four regular RAMs can be replaced by the sevent d redundant zones, and four arbitrary defective cluster bits which reside in the four regular RAMs can be replaced by the four h redundant zones. In other words, the seven c redundant zones of each 1-bit memory cell array unit 18 of the redundant RAM 14 can replace seven arbitrary a zones of the 128 a zones in 1-bit memory cell array units 17a to 17d of the four regular RAMs, the seven d redundant zones can replace seven arbitrary b zones of the 1,024 b zones of 1-bit memory cell array units 17a to 17d of the four regular RAMS, and the four h redundant zones can replace four arbitrary g zones of the 4,096 g zones of 1-bit memory cell array units 17a to 17d of the four regular RAMs.

It should be noted that each d redundant zone has a shape different from that of each b zone and each h redundant zone has a shape different from that of each g zone. As previously explained in Embodiment 1, to enable the mapping to a memory space having a different shape and the same size, that is, to enable accesses to d and h redundant zones having such different shapes of the redundant RAM 14, the semiconductor memory performs address scrambling different from that performed for each regular RAM. Furthermore, even in the case of accessing each c redundant zone having the same shape as each a zone, the semiconductor memory performs address scrambling different from that performed for each regular RAM so as to enable the access to each c redundant zone of the redundant RAM 14, by which a defective a zone can be replaced.

As previously mentioned, the redundant RAM 14 is not limited to a set of two memory cell arrays each having 512 rows and 64 columns. As an alternative, it can be a set of two memory cell arrays each having 256 rows and 128 columns.

In FIG. 19, reference numeral 19c denotes a single fuse block disposed in a fuse block 150 and intended for replacement of defective cluster bits. Each fuse block 19c is so designed as to output "0" usually and to output "1" when programmed with laser trimming or by the application of a high voltage. When replacing an arbitrary defective cluster bit of one regular RAM with the kth (k=0 to 3) h redundant zone of the redundant RAM 14, fourteen signle fuse blocks 19c are disposed to generate one enable signal and thirteen address signals. In other words, to repair four arbitrary defective cluster bits within the four regular RAMs, fourteen signle fuse blocks 19c intended for replacement of defective cluster bits can be programmed. A fuse determination circuit (not shown in the figure) is included in each of the fourteen single fuse blocks 19c of each set, and outputs of those fourteen fuse determination circuits will be called FBkEN, FBkX2, FBkX3, FBkX4, FBkX5, FBkX6, FBkX7, FBkX8, FBkY1, FBkY2, FBkY3, FBkY4, FBkZ0, and FBkZ1, respectively, from here on.

Furthermore, reference numeral 42 denotes an address encoder intended for redundant row lines, for generating an address ENCR<2;0> from outputs HITR0 to HITR6 of seven AND gates 25 associated with the seven redundant row lines, and reference numeral 43 denotes an OR gate for implementing a logical OR operation on HITR0 to HITR6 and for outputting an OR operation result HITR. In addition, reference numeral 50 denotes an address comparison circuit intended for redundant cluster bits, for outputting "1" when the seven highmost bits of an input row address, i.e., X<8;2>, the four highmost bits of an input column address, i.e., Y<4;1>, and an input RAM selection address Z<1;0> match up with programmed addresses Xk<8;2>, Yk<4;1>, and Zk<1;0>(k=0 to 3), i.e., FBkX2, FBkX3, FBkX4, FBkX5, FBkX6, FBkX7, FBkX8, FBkY1, FBkY2, FBkY3, FBkY4, FBkZ0, and FBkZ1, respectively, reference numeral 51 denotes an AND gate for implementing a logical AND operation on FBkEN and an output of a corresponding address comparison circuit 50 intended for redundant cluster bits and for outputting an AND operation result HITBk (k=0 to 3). Therefore, four address comparison circuits 50 intended for redundant cluster bits and four AND gates 51 are disposed for the four redundant cluster bits, respectively. Furthermore, reference numeral 52 denotes an address encoder intended for redundant cluster bits, for generating an address ENCB<1;0> from the outputs HITB0 to HITB3 of the four AND gates 51 associated with the four redundant cluster bits, and reference numeral 53 denotes an OR gate for implementing a logical OR operation on the outputs HITB0 to HITB3 and for outputting an OR operation result HITB. Reference numeral 54 denotes an OR gate for implementing a logical OR operation on HITC, HITR, and HITB, and for outputting an OR operation result as an NED signal. Therefore, the NED signal shows the logical OR of HITC0 to HITC6, HITR0 to HITR6, and HITB0 to HITB3. Furthermore, reference numeral 55 denotes an address scrambling circuit (address scrambling means) for generating a row address XR<8;0> to be applied to the redundant RAM 14 from the input row address X<8;0>, the input column address Y<4;0>, the address ENCR<2;0> from the redundant row address encoder 42, and the address ENCB<2;0> from the redundant bit address encoder 52 according to a given address scramble table.

In the following, only an operation of the semiconductor memory which is different from that of the semiconductor memory of the above-mentioned first embodiment will be explained.

When there is a cluster bit defect in one regular RAM within the semiconductor memory, the defective cluster bit is replaced by a redundant cluster bit of the redundant RAM 14, e.g., one h redundant zone of FIG. 20. When replacing a cluster bit defined by the seven highmost bits of the input row address, i.e., X<8;2>=Xk<8;2>, the four highmost bits of the input column address, i.e., Y<4;1>=Yk<4;1>, and the input RAM selection address Z<1;0>=Zk<1;0> with the kth redundant cluster bit, the fuses FBkEN, FBkXs, FBkYt, and FBkZu are programmed, where s, t, and u are bit numbers that satisfy the following equations: Xk<s>=1, Yk<t>=1, and Zk<u>=1 in the addresses Xk<8;2>, Yk<4;1>, and Zk<1;0>. For example, when k=0, and X0<8;2>=(0001100), Y0<4;1>=(0110), and Z0<1;0>=(01), s=4, 5, t=2, 3, and u=0, and therefore the following six fuses: FB0EN, FB0X4, FB0X5, FB0Y2, FC0Y3, and FC0Z0 are programmed.

When there is a cluster bit defect in one regular RAM within the semiconductor memory, as mentioned above, and the seven highmost bits of the input row address, i.e., X<8;2>, the four highmost bits of the input column address, i.e., Y<4;1>, and the input RAM selection address Z<1;0> match up with programmed addresses Xk<8;2>, Yk<4;1>, and Zk<1;0>, respectively, the corresponding kth address comparison circuit 50 intended for redundant cluster bits outputs "1". Since the corresponding fuse FBkEN for generation of an enable signal is programmed, it always outputs "1". Therefore, when the kth address comparison circuit 50 intended for redundant cluster bits outputs "1", the hit signal HITBk becomes state "1". As a result, the combination of the OR gates 23, 43, 53, and 54 implements a logical OR operation on HITC0 to HITC6, HITR0 to HITR6, and HITB0 to HITB3, and then generates the NED signal at state "1". In addition, the OR gates 34a to 34d, which generate CECN signals to be applied to the four regular RAMs 13a to 13d, respectively, all generate the CECN signals at state "1" based on the NED signal at state "1", as shown in FIG. 1. Therefore, all of the four regular RAMs 13a to 13d enter a non-selection state. Furthermore, since control signals applied to tri-state buffers 36a to 36d which control the outputs DQN<15;0> of the four regular RAMs 13a to 13d, respectively, become state "0", all the outputs of the tri-state buffer 36a to 36d have high impedances. Therefore, no data is output from any one of the four regular RAMs.

On the other hand, since the inverter 30 outputs the inversion of the NED signal at state "1" to the OR gate 31, the OR gate 31 outputs the CECR signal of the same value as the CEC signal of negative-true logic to the redundant RAM 14. Therefore, the redundant RAM 14 enters a selection state in which it is selected according to the CECR signal. Furthermore, since the NED signal at state "1" is applied as a control signal to a tri-state buffer 37 shown in FIG. 1, the tri-state buffer 37 is enabled and then outputs the output data DQR<15;0> from the redundant RAM 14 as the output data DQ<15;0> of the semiconductor memory.

In the case of bit redundancy, the address scrambling circuit 55 generates a redundant RAM row address XR<8;0> to be applied to the redundant RAM 14 from the two lowermost bits of the input row address, i.e., X<1;0>, the two lowermost bits of the input column address, i.e., Y<1;0>, the address ENCB<2;0> generated by the address encoder 52 intended for redundant cluster bits, and the address ENCR<2;0> generated by the address encoder 42 intended for redundant row lines. Concretely, the address scrambling circuit 55 connects bits 1 and 0 of the input row address, i.e., X<1;0> to bits 0 and 1 of the redundant RAM row address, i.e., XR<1;0> to be applied to the redundant RAM 14, connects bits 0 and 1 of the input column address, i.e., Y<1;0> to bits 2 and 3 of the redundant RAM row address, i.e., XR<3;2>, connects the address ENCB<1;0> generated by the address encoder 52 intended for redundant cluster bits to bits 4 and 5 of the redundant RAM row address, i.e., XR<5;4>, and connects the address ENCR<2;0> generated by the address encoder 42 intended for redundant row lines to bits 6 to 8 of the redundant RAM row address, i.e., XR<8;6>, according to the address scramble table shown in a "bit redundancy" column in FIG. 21. As already mentioned, the address ENCC<2;0> generated by the address encoder 22 intended for redundant column lines is directly connected to a redundant RAM column address YR<2;0> to be applied to the redundant RAM 14.

FIG. 22 is a diagram showing possible values of the address ENCC<2;0> generated by the address encoder 22 intended for redundant column lines, and corresponds to FIG. 6 in the above-mentioned first embodiment. Furthermore, FIG. 23 is a diagram showing possible values of the address ENCR<2;0> generated by the address encoder 42 intended for redundant row lines, and corresponds to FIG. 7 in the above-mentioned first embodiment. In addition, FIG. 24 is a diagram showing possible values of the address ENCB<1;0> generated by the address encoder 52 intended for redundant cluster bits. FIG. 24 shows a relationship between the HITBk signal at state "1" and the generated address ENCB<1;0> when the HITBk signal corresponding to the kth (k=0 to 3) redundant cluster bit is at state "1", and k expressed in the form of a binary number is equivalent to the address ENCB<1;0>.

When the seven highmost bits of the input row address, i.e., X<8;2>, the four highmost bits of the input column address, i.e., Y<4;1>, and the input RAM selection address Z<1;0> do not match up with any programmed addresses Xk<8;2>, Yk<4;1>, and Zk<1;0>, respectively, any hit signal HITBk remains at state "0". As a result, the combination of the OR gates 23, 43, 53, and 54 implements a logical OR operation on HITC0 to HITC6, HITR0 to HITR6, and HITB0 to HITB3, and then generates the NED signal at state "0". At this time, if there is no column defect and no row defect the semiconductor memory operates as in the case where there is no defective memory cell in any regular RAM.

As mentioned above, when there is a cluster bit defect in any one of the four regular RAMs, only the defective cluster bit is logically replaced by a specific redundant cluster bit of the redundant RAM 14, for example, one h redundant zone of FIG. 20. In other words, since the redundant RAM 14 has four (k=0 to 3) redundant cluster bits, for example, four h redundant zones of FIG. 20 and arbitrary addresses Xk<8; 2>, Yk<4;1>, and Zk<1;0> can be programmed for each of the four redundant cluster bits, it is possible to repair four arbitrary defective cluster bits included in the four regular RAMs, i.e., RAM0, RAM1, RAM2, and RAM3 by replacing them with the four redundant cluster bits.

Therefore, the second embodiment of the present invention can provide the same advantages as offered by the above-mentioned first embodiment. Furthermore, in accordance with the second embodiment of the present invention, the semiconductor memory can repair several kinds of different defective zones including defective cluster bits by replacing them with corresponding redundant zones within the redundant RAM 14, respectively. In other words, the semiconductor memory can repair an arbitrary plurality of defective cluster bits included in the four regular RAMs 13a to 13d in addition to an arbitrary number of defective column lines and defective row lines included in the four regular RAMs, thereby further improving yields.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor memory comprising:
   a regular RAM having a plurality of memory cells arranged in an array with a first row number and a second column number, such that each row is selectable from said first row number according to a regular row address signal, while each column is selectable from said second column number according to a regular column address signal;
   a redundant RAM having a plurality of memory cells arranged in an array with a third row number and a fourth column number, such that said plurality of memory cells is selectable instead of the defective memory cell of said regular RAM;
   a conversion circuit for converting said regular row address signal into a redundant column address signal for making a column selection at said redundant RAM, or converting said regular column address signal into a redundant row address signal for making a row selection at said redundant RAM,
   such that an address selection is changeable from a first memory cell area of said regular RAM including said defective memory cell and having a fifth row number and a sixth column number to a second memory cell area of said redundant RAM and having a seventh row number and an eighth column number different from said fifth row number and said sixth column number respectively.

2. The semiconductor memory according to claim 1, said first row number being equal to said third row number, and further comprising a second conversion circuit for converting said regular row address signal into said redundant row address signal, and converting the signal of said regular column address signal line into a redundant column address signal, such that an address selection is changeable from said first memory cell area to a third memory cell area of said redundant RAM and having said fifth row number and said sixth column number.

3. The semiconductor memory according to claim 1, comprising a control circuit for generating a hit signal where an address corresponding to a signal applied to said regular row address signal line and said regular column address signal line matches up with the address of said defective memory cell to output said redundant row address signal or said redundant column address signal from said first conversion circuit to said redundant RAM.

4. The semiconductor memory according to claim 1, wherein said redundant RAM is arranged between a first regular RAM and a second regular RAM.

5. A semiconductor memory comprising:
   a regular RAM having a plurality of memory cells arranged in a matrix;
   a redundant RAM having a plurality of memory cells arranged in a matrix including redundant memory elements by which defective memory elements of said regular RAM can be replaced;
   a conversion circuit for converting a signal corresponding to a regular row address signal of said regular RAM into a redundant column address signal for making a column selection at said redundant RAM, or converting a signal corresponding to a regular column address signal of said regular RAM into a redundant row address signal for making a row selection at said redundant RAM, wherein said redundant memory elements, with a first redundant area and a second redundant area, can be provided such that a row number and a column number are different in the two redundant areas.

6. The semiconductor memory according to claim 5, wherein said redundant RAM is arranged between a first regular RAM and a second regular RAM.

* * * * *